United States Patent [19]

Larsen et al.

[11] Patent Number: 4,878,179

[45] Date of Patent: Oct. 31, 1989

[54] INTERACTIVE DIAGNOSTIC METHODOLOGY AND APPARATUS FOR MICROELECTRONIC DEVICES

[75] Inventors: Robert P. Larsen, Fullerton; Steven T. Hoelke, Claremont; James A. Luisi, Anaheim, all of Calif.

[73] Assignee: Rockwell International Corporation, El Segundo, Calif.

[21] Appl. No.: 119,741

[22] Filed: Nov. 12, 1987

[51] Int. Cl.$^4$ .................. G01R 31/28; G06F 11/00
[52] U.S. Cl. .................. 364/490; 324/73 AT; 364/580; 371/25.1; 371/22.1
[58] Field of Search .................. 364/489, 490, 580; 324/73 R, 73 AT, 158 R; 371/23, 24, 25

[56] References Cited

U.S. PATENT DOCUMENTS

| | | | |
|---|---|---|---|
| 3,633,100 | 1/1972 | Heilweil et al. | 371/23 X |
| 4,228,537 | 10/1980 | Henkels et al. | 371/23 |
| 4,503,536 | 3/1985 | Panzer | 371/25 |
| 4,510,572 | 4/1985 | Reece et al. | 371/25 X |
| 4,696,006 | 9/1987 | Kawai | 371/25 X |
| 4,761,607 | 8/1988 | Shiragasawa et al. | 371/25 X |
| 4,763,066 | 8/1988 | Yeung et al. | 324/73 R |
| 4,771,428 | 9/1988 | Acuff et al. | 371/25 |

*Primary Examiner*—Felix D. Gruber
*Attorney, Agent, or Firm*—H. Fredrick Hamann; George A. Montanye; Wilfred G. Caldwell

[57] ABSTRACT

An interactive diagnostic methodology and apparatus that enables a specimen (microelectronic device) to undergo detailed behavioral examination while allowing the Diagnostician to incrementally proceed from a set of symptoms to a formal diagnosis. Diagnostic tactics are predicated on comparing measured behavior to predicted behavior. The methodology allows coupling to a variety of behavior-level, switch-level (state), and circuit-level (node) simulators in determining predicted behavior. The architecture allows a variety of beam-probing apparatus to be supported in acquiring nodal waveforms and logic state images from a specimen as a means of determining measured behavior. This measured behavior can be graphically compared to the predicted behavior for study and analysis by the Diagnostician to aid in the formulation of diagnostic tactics. The ability to easily couple a wide variety of simulation techniques and beam probing apparatus is achieved by viewing simulation and measurement as generic functions, which can be executed concurrently, from an architectural standpoint. To accelerate nodal navigation and model extraction, an object clustering data structure is used that exploits apriori continuity relationships between objects, symbolically representing the specimen's design. The importance of defining stimuli, for exercising the specimen under various measurement and simulation conditions, is fully recognized with an integrated capability for the interactive composition and modification of stimuli patterns. The apparatus architecture provides for network coupling to the CAD environment for access to information concerning the specimen's design and in performing simulation activities to support diagnostic tactics.

10 Claims, 29 Drawing Sheets

Microfiche Appendix Included
(3 Microfiche, 274 Pages)

```
GENERIC SIMULATION DIRECTIVES

BEHAVIOR CLASS
      INPUT NODE SET OF MODEL   (NODE NAME OR X/Y LOCATION)
      OUTPUT NODE SET OF MODEL  (NODE NAME OR X/Y LOCATION)
      STIMULI PATTERN
      SAMPLE PERIOD

STATE CLASS
      INPUT NODE SET OF MODEL   (NODE NAME OR X/Y LOCATION)
      OUTPUT NODE SET OF MODEL  (NODE NAME OR X/Y LOCATION)
      STIMULI PATTERN
      SAMPLE PERIOD

NODE CLASS
      NODE NAME OR X/Y LOCATION
      STIMULI PATTERN
      SAMPLE PERIOD
```

FIG. 25

```
GENERIC STIMULATION RESPONSES

STATE CLASS
      NODE-STATE-TIME VECTORS

NODE CLASS
      NODE NAME OR X/Y LOCATION
      VOLTAGE-TIME VECTORS
```

FIG. 26

```
GENERIC MEASUREMENT DIRECTIVES

ACQUIRE WAVEFORM CLASS
      NODE X LOCATION (MICRONS)
      NODE Y LOCATION (MICRONS)
      MEASUREMENT START TIME (BIT-TIME)
      MEASUREMENT STOP TIME (BIT-TIME)
      REQUESTED VOLTAGE RESOLUTION (VOLTS)
      REQUESTED TIME RESOLUTION (SECONDS)

ACQUIRE IMAGE CLASS
      FIELD X LOCATION (MICRONS)
      FIELD Y LOCATION (MICRONS)
      FIELD SIZE (MICRONS)
      TIME WINDOW (BIT-TIME)

STIMULATE DEVICE CLASS
      STIMULI PATTERN

REFERENCE LOCATION REQUEST CLASS
      "NEED REGISTRATION LANDMARK"
         OR
      "NEED LOCAL GROUND REFERENCE"
```

```
GENERIC MEASUREMENT RESPONSES

WAVEFORM CLASS
      ARRAY OF VOLTAGE-TIME PAIRS
         OR
      "NO WAVEFORM AVAILABLE"

IMAGE CLASS
      2-D ARRAY OF PIXELS (FOUR GRAY LEVELS)
         OR
      "NO IMAGE AVAILABLE"

LOGIC STATE MAP CLASS
      IMAGE (2-D ARRAY OF PIXELS (LOGIC HIGH, LOW, UNDEFINED))
         OR
      "NO IMAGE AVAILABLE"

COORDINATES CLASS
      NODE X LOCATION (MICRONS)
      NODE Y LOCATION (MICRONS)
```

INTERACTIVE DIAGNOSTIC METHODOLOGY AND APPARATUS FOR MICROELECTRONIC DEVICES

This invention was made with Government support under Contract No. DAAL01-85-C-0440 awarded by the Department of Army. The Government has certain rights in this invention.

MICROFICHE APPENDIX

This application includes a microfiche appendix containing a computer program. The appendix comprises three microfiches and a total of 274 frames.

BACKGROUND OF THE INVENTION

1. Field of the Invention

The invention analyzes VLSI chips for defects.

2. Description of the Prior Art

The use of electron-beam, ion-beam, and laser-beam probing technologies as a means of verifying behavior in microelectronic devices is gaining acceptance. Generally, these techniques compare strobescopic images extracted from faulty and good devices using image subtraction techniques as reported by Oxford and Propst. [W. V. Oxford and R. H. Propst, "Efficient Computer-Aided Failure Analysis of Integrated Circuits using Scanning Electron Microscopy", IEEE Transactions on Reliability, Vol. R-34, No. 5, December 1985, pp. 410–417]. Another comparative technique utilizes the comparison of logic state maps extracted from the faulty device and compared to the expected, generated by logic simulation techniques, as reported by Kuiji, Tamama, and Nagatani. [N. Kuiji, T. Tamama and M. Nagatani, "FINDER: A CAD System-Based Electron Beam Tester for Fault Diagnosis of VLSI Circuits", IEEE Transactions on Computer-Aided Design, Vol. CAD-5, No. 2, April 1986, pp 313–319]. However, the development of a sequence of images from a specimen operating at high speed takes considerable time (hours) and includes large amounts of redundant and useless data.

Recently, Concina and Richardson discussed a diagnostic methodology which is based on comparison of simulated and measured images and nodal waveforms. [S. Concina and N. Richardson, "Workstation-Driven E-Beam Prober", Proceedings of the IEEE International Test Conference, Washington, D.C., Sept. 1–3, 1987, pp 554–560]. Some of the algorithms and data structures used by this system is discussed by Concina and Liu and are based on mask layer oriented design information [S. Concina and G. S. Liu, "Integrating Design Information for IC Diagnosis", Proceedings of the IEEE 24th Design Automation Conference, Miami Beach, Fla., pp 251–257]. This system incorporates electron beam probing apparatus as an integral part of a workstation computer.

SUMMARY OF THE INVENTION

Our diagnostic system incorporates some new features not found in documented systems [J. A. Luisi, S. T. Hoelke, and R. P. Larsen, "Computer Aided Electron-beam Testing (CADET)", Proceedings of the 1986 Government Microcircuit Applications Conference, San Diego, CA., November 11–13, 1986, pp 547–551]. It provides an interactive diagnostic methodology that allows the Diagnostician to incrementally formulate a diagnosis from a set of given symptoms associated with the specimen undergoing detailed behavioral examination. The integration of the simulation techniques and beam probing and stimuli generation apparatus is generalized through the use of a generic interface concept resulting in improved simulation and measurement generality and flexibility. The system exploits the concept of abstraction by utilizing an object-oriented symbolic representation of the specimen's design. This underlies the symbolic navigation concepts used to simplify and accelerate the identification of node sites and landmarks. The generation of stimuli patterns to exercise the specimen is integrated into the system as opposed to the ad hoc stimuli and specimen exercising treatment being practiced in documented systems. The object clustering data structure employed possesses continuity relationships that accelerate model extraction for switch-level simulation and circuit analysis by recognizing the benefits of a constant model concept. These features are used to accelerate diagnoses, ease and promote exploration of nodal behavior by symbolic navigation, and improve the pictorial comparative presentations relied on in performing diagnoses of abnormal behavior in microelectronic devices.

This invention more particularly relates to the problems associated with diagnosing abnormal behavior in microelectronic devices using non-contact probing apparatus based on electron, ion, and/or laser beam technologies.

Important objectives of this invention include creating an interactive diagnostic methodology that has procedural rigor enabling the Diagnostician to incrementally proceed from a set of symptoms to a formal diagnosis representing the specimen undergoing detailed behavioral examination; that exploits the complementary support of simulation and measurement; that utilizes a generic interface to support a variety of beam-probing apparatus for acquiring waveforms or images; that utilizes a generic interface to support a variety of behavior, state, and nodal simulators residing in the specimen's native CAD environment to predict nodal waveforms and state maps; that integrates the apparatus for controlling the exercising electronics which provides the appropriate stimuli to dynamically exercise the specimen's suspect circuitry; that enables concurrent execution of simulation and measurement requests; that provides symbolic nodal navigation to the Diagnostician through the hierarchical object clustering representation of the specimen's design in identifying nodes and areas of interest; and that provides enhanced color graphics displays of design, stimuli, waveforms, and images, in a multi-window presentation, for enhanced comparative analysis and evaluation by the Diagnostician.

The foregoing and additional features and advantages of the invention will become more readily apparent from the following detailed description of a specific illustrative embodiment thereof, presented hereinbelow in conjunction with the accompanying drawings, in which:

BRIEF DESCRIPTION OF THE DRAWINGS

FIG. 25, including Table 1, shows the Generic Simulation Directives and Responses;

FIG. 26, comprising Table 2, shows the Generic Measurement Directives and Responses;

DESCRIPTION OF THE PREFERRED EMBODIMENT

Figure 1:
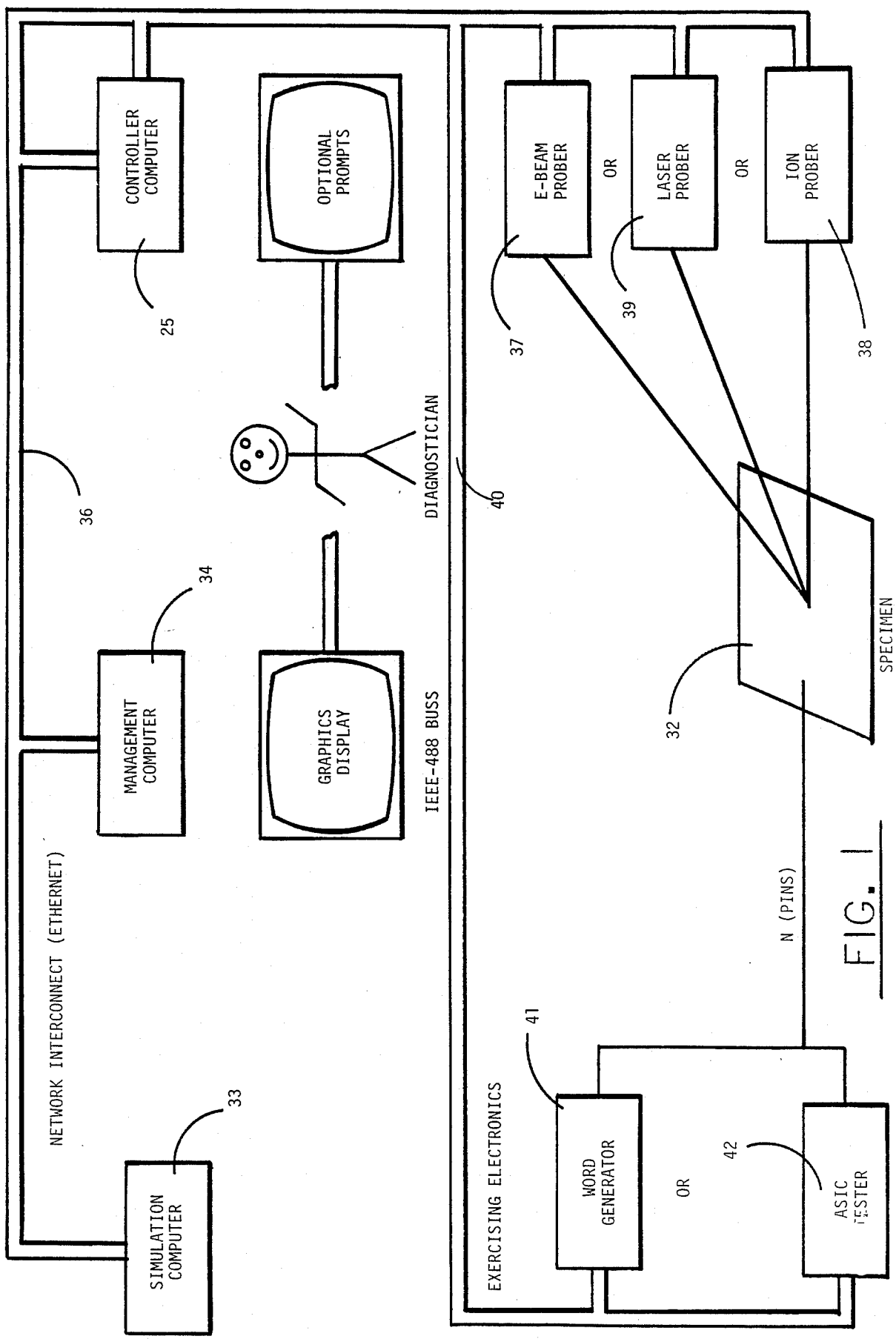
FIG. 1 represents a typical apparatus configuration supporting the interactive diagnostic methodology and shows its relationship with the Diagnostician and specimen.

Hardware that has proven successful in the Hardware Configuration of FIG. 1 is as follows:

For COMPUTERS 33, 34, 35 and associated graphics and prompts

> DEC MICRO VAX - II/GPX
> For WORD GENERATOR 41
>     HP 8180A Data Generator
> For ASIC TESTER 42
>     IMS HS 1000
> For E-BEAM PROBER 37
>     Cambridge S250/Lintech
>     or
>     Lintech E-Beam Tester
>     or
>     ABT IL-200/ISI WB6
> For LASER PROBER 39
>     Mitsui Data*Probe Model 2010

-continued

For ION PROBER 38

Several research laboratories across the United States are presently developing suitable ION PROBERS 38 which will be commercially available soon.

Referring now to FIG. 1, the diagnostic apparatus generally consists of a multi-computer/workstation configuration with SIMULATION COMPUTER 33, MANAGEMENT COMPUTER 34 and CONTROLLER COMPUTER 35 coupled via an ETHERNET link 36 that supports asynchronous bilateral communications. These computers support the event management, simulation, and measurement functions incorporated into the interactive diagnostic methodology. The generic measurement function allows electron-beam (E-BEAM PROBER 37), ion-beam (ION PROBER 38), and/or laser-beam (LASER PROBER 39) probing apparatus for SPECIMEN 32 to be simply coupled through an IEEE 488 general purpose interface bus 40 (GPIB). A similar generic interface to the simulation functions, residing in the specimen's native CAD environment, enables a variety of simulation techniques to be employed in predicting nodal waveforms and state maps. The CAD system is represented by SIMULATION COMPUTER 33. The apparatus configuration also contains provision for controlling the exercising electronics (WORD GENERATOR 41 or ASIC TESTER 42) which provides the appropriate stimuli to dynamically exercise the specimen during diagnostic examination. ASIC TESTER 42 (VLSI tester) is an application specific integrated circuit (ASIC) tester of conventional design.

Figure 2:
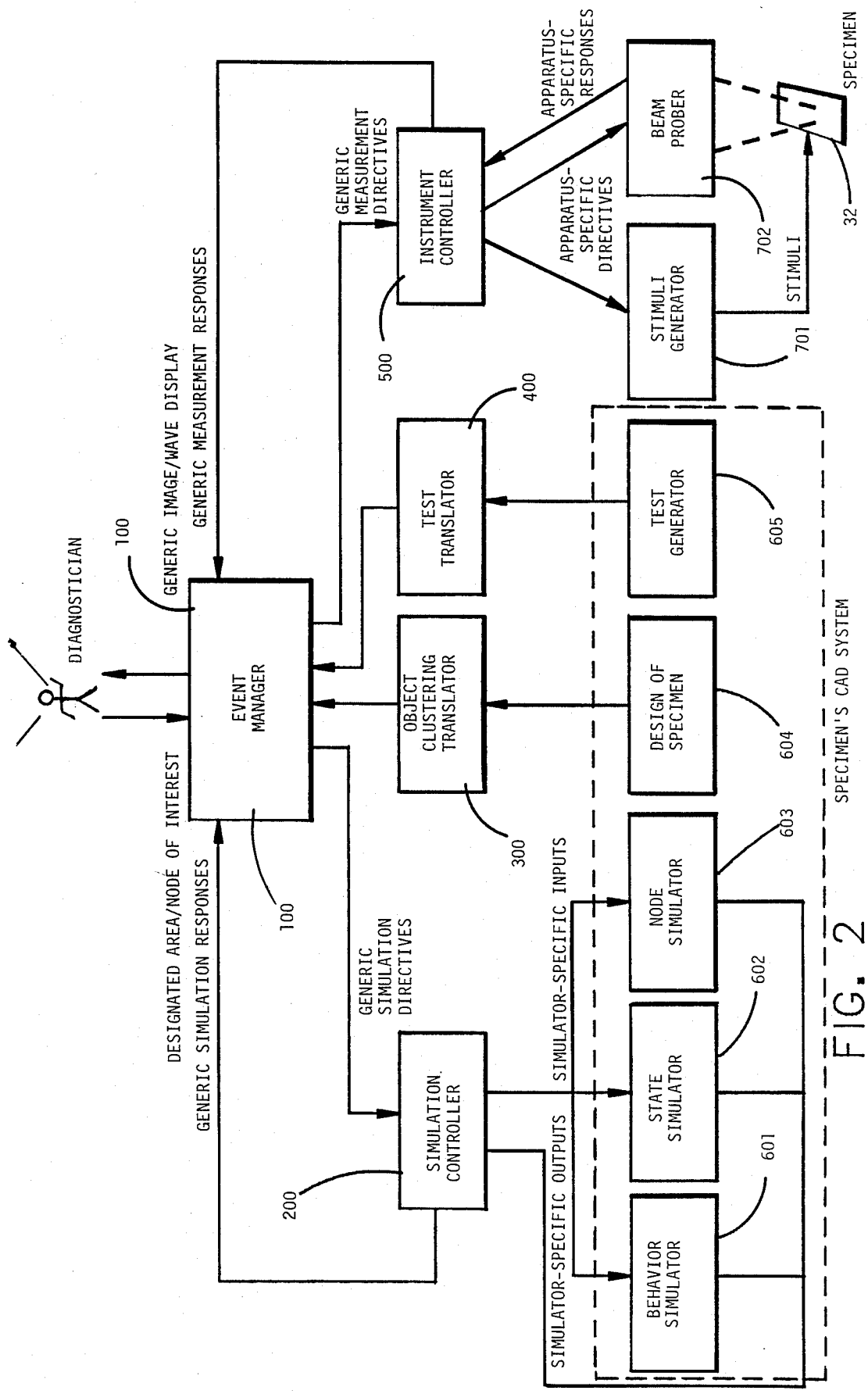
FIG. 2 represents the overall software architecture supporting the interactive diagnostic methodology and shows its relationship to the Diagnostician and specimen.

Referring to FIG. 2, there is shown the overall architecture and data flow relationships for implementing an interactive diagnostic methodology incorporating the principles of this invention. It shows the two major components operating in conjunction with the EVENT MANAGER (Block 100), the SIMULATION CONTROLLER (Block 200) and the INSTRUMENT CONTROLLER (Block 500), comprising the interactive diagnostic methodology. Two additional interfacing components provide for receiving the specimen's design information, the OBJECT CLUSTERING TRANSLATOR (Block 300) and the functional test (stimuli/response) patterns, i.e., TEST TRANSLATOR (Block 400). The two major components, SIMULATION CONTROLLER 200 and INSTRUMENT CONTROLLER 500 can operate concurrently. These two operating components are coordinated through a third component, EVENT MANAGER 100, which issues generic directives and receives generic responses. The EVENT MANAGER 100 spawns and synchronizes tasks in accordance with these generic directives/responses. The Diagnostician interprets the pictorial presentations of expected and acquired waveforms/images, in a multi-window format, and directs event sequencing through menu options selected by mouse 50 (FIG. 3) manipulations.

The SIMULATION CONTROLLER 200 translates the generic simulation directives into simulator-specific input files for loading to predesignated BEHAVIOR SIMULATOR (Block 601), STATE (Block 602), or NODE (Block 603) SIMULATOR. These simulators may be local or remote since they are invoked as dynamic task objects. Following completion of the simulation task, the simulator-specific behavior file is translated into a generic response and returned to the EVENT MANAGER 100 for appropriate stacking. A unique feature of the SIMULATION CONTROLLER 200 is its ability to rapidly create signal flow graph models (see FIG. 6) for switch-level STATE SIMULATOR 602 and node models (see FIG. 5) for NODE CIRCUIT SIMULATOR 603. This is accomplished through a common node-oriented data structure, derived from the specimen's design information, which is specifically tailored for rapid model construction. This data structure preserves topological relationships defining source, sink, and distribution models, including transistor sizes and node-to-node coupling capacitances. These modeling parameters and nodal topologies are derived from an object-oriented symbolic design representation featuring a hierarchy of objects. The lowest level structural objects are clustered to save the topological property of connectedness. The apriori construction of this nodal data structure is performed by the OBJECT CLUSTERING TRANSLATOR 300 prior to diagnostic activities since the specimen's design is considered frozen with regard to behavioral diagnosis.

The INSTRUMENT CONTROLLER 500 is coupled to STIMULI GENERATOR apparatus (Block 701) and electron-beam, ion-beam, and/or laser-beam probing apparatus BEAM PROBER (Block 702) that allows probing internal nodes of the specimen with negligible circuit loading. The underlying sampling algorithm uses topography and topology information derived from the specimen's symbolic design data to aid in obtaining the requisite measurements. The stimuli conditioning of the specimen and the measurements are performed by controlling the actions of individual instruments using the IEEE 488 GPIB (general purpose interface bus). The stimuli pattern, consisting of input signals and predicted output signals, can be loaded through the TEST TRANSLATOR 400 and subjected to interactive graphical editing in the EVENT MANAGER 100. This stimuli loop and the sampling period can be quickly modified using these same graphical editing techniques.

Waveforms are captured by dynamically exercising the specimen with a stimuli loop in which a sampling period can be defined anywhere within the repeating pattern; i.e., analogous to using a "SCOPE LOOP" test in conventional oscilloscope pulse testing of electronic circuits. The EVENT MANAGER 100 issues generic measurement directives to the INSTRUMENT CONTROLLER 500 and it responds with generic responses. The INSTRUMENT CONTROLLER 500 must contain an apparatus-specific driver for each prober and stimuli generator comprising the apparatus configuration.

The unique concept underlying this diagnostic methodology is the use of simulation to support and accelerate the measurement function, and vice versa. The modular structuring of these major components will support remote as well as local simulation and/or measurement using bilateral asynchronous communications. This allows the diagnostician to perform the simulation activities in a native, remote CAD computer/workstation environment (see 601-605, FIG. 2). The option to perform simulations in the accustomed manner improves the acceptance and convenience of utilizing this diagnostic methodology. By supporting remote simulation and/or measurement, the Diagnostician is allowed to configure the resources as deemed appropriate. This includes the protection of proprietary modeling and process information which need not be revealed to the Diagnostician.

The use of a generic simulation interface enables a wide range of circuit (node), switch-level (state), and/or behavior simulators to be used in support of diagnostic tactics. Similarly, use of a generic measurement interface allows easy coupling to a variety of beam-probing and stimuli generation apparatus. The generic treatment of simulation and measurement means the bilateral communications between the EVENT MANAGER 100, SIMULATION CONTROLLER 200, and INSTRUMENT CONTROLLER 500 remains constant. The simulation-specific coupling is performed by input/output file format transformation while the apparatus-specific coupling is via apparatus-specific device drivers. This form of generic software-hardware interfacing enables the interactive diagnostic methodology to support a wide spectrum of simulation and beam probing techniques while maintaining a constant interactive diagnostic methodology to the Diagnostician.

EVENT MANAGER

Figure 3:
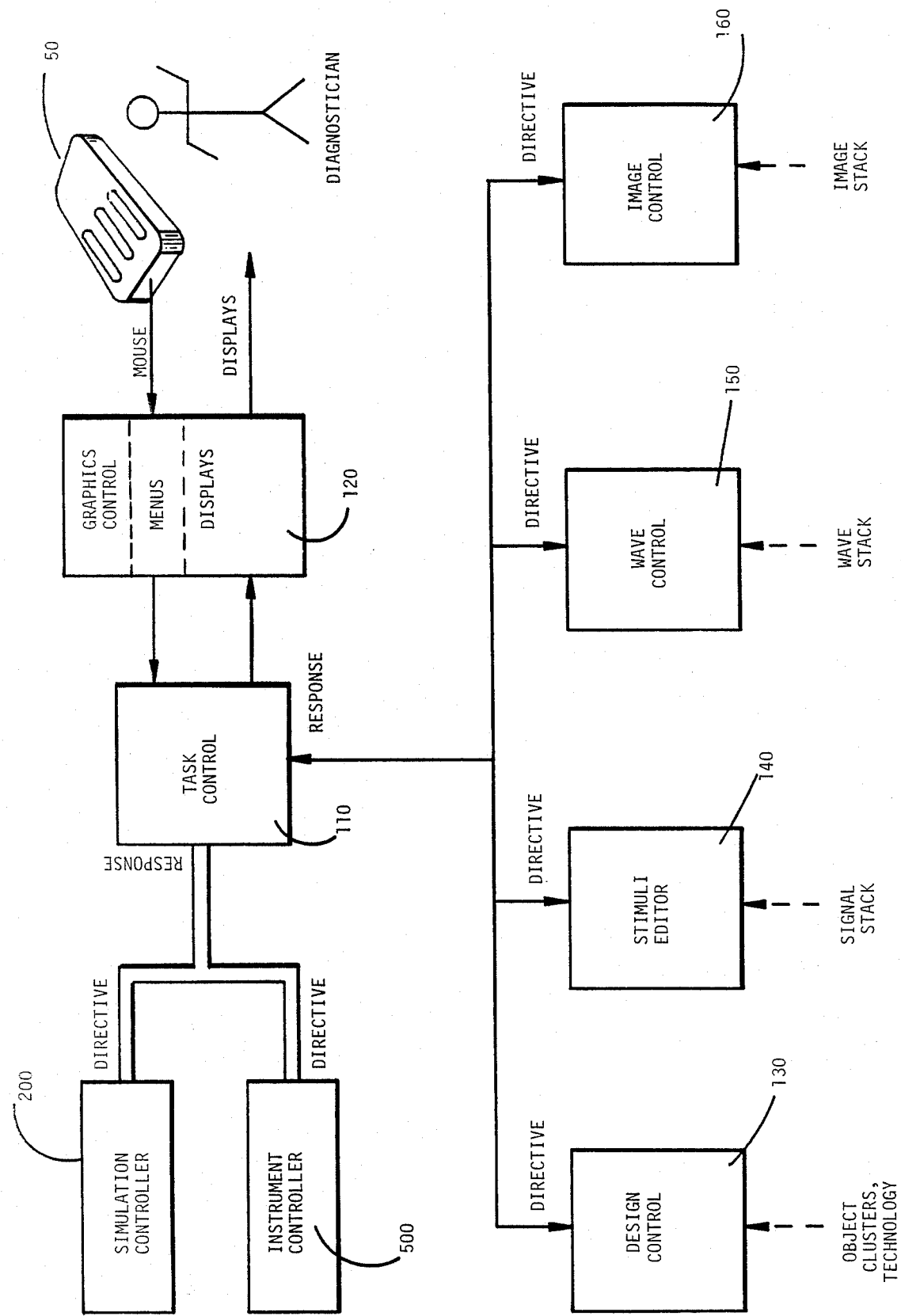
FIG. 3 shows the components of the Event Manager Block Diagram.

The EVENT MANAGER 100 coordinates all communications with the Diagnostician and controls all event sequencing with dynamic task objects. Referring to FIG. 3, there is shown the overall architecture and data flow relationships for implementing the EVENT MANAGER incorporating the principles of this invention. The Diagnostician directs the event sequencing by selecting options from menus, representing the control state hierarchy, using mouse manipulations. Once a menu option is designated, the GRAPHICS CONTROL (Block 120) returns the designated menu option to TASK CONTROL (Block 110). TASK CONTROL 110 classifies the action implied by knowing the present control state and transitions to the new control state within the control state hierarchy.

If, in a measurement/simulation control state, a generic simulation directive is formulated and a message is sent to the SIMULATION CONTROLLER 200 (FIG. 2) and also a generic measurement directive is formulated and a message sent to the INSTRUMENT CONTROLLER 500 for concurrent execution.

Upon completion of these tasks, the TASK CONTROLLER 110 will receive a generic simulation response and a generic measurement response and the related dynamic tasks will perform the requisite updating of data structures. Then GRAPHICS CONTROL 120 updates the related graphical presentations within the related windows. Since these responses are received CONTROL 110 at different times due to concurrent execution of the simulation and measurement tasks TASK CONTROL 110 needs to synchronize these spawned tasks. This asynchronous control scheme allows the Diagnostician to easily spawn several simulation/measurement tasks in a short period of time (one minute), resulting in a complex multi-tasking environment for TASK CONTROL 110 to supervise.

If TASK CONTROL 110 detects a design state, it then dynamically allocates a design task which awakens DESIGN CONTROL (Block 130) and passes the design directive to it. Upon completion of the design task, TASK CONTROL 110 receives a design response, e.g., a node site or model definition, and DESIGN CONTROL 130 becomes inactive, goes to sleep, and the design task is de-allocated. TASK CONTROL 110 then directs GRAPHICS CONTROL 120 to update any window presentations and to display a menu related to the present control state. This control and tasking scenario is similarly executed between TASK CONTROL 110 and STIMULI EDITOR (Block 140), WAVE CONTROL (Block 150), and IMAGE CONTROL (Block 160). It is assumed that these supportive design, stimuli, and diagnostic control functions are executed on the same computer/workstation hosting the EVENT MANAGER 100.

Figure 4:
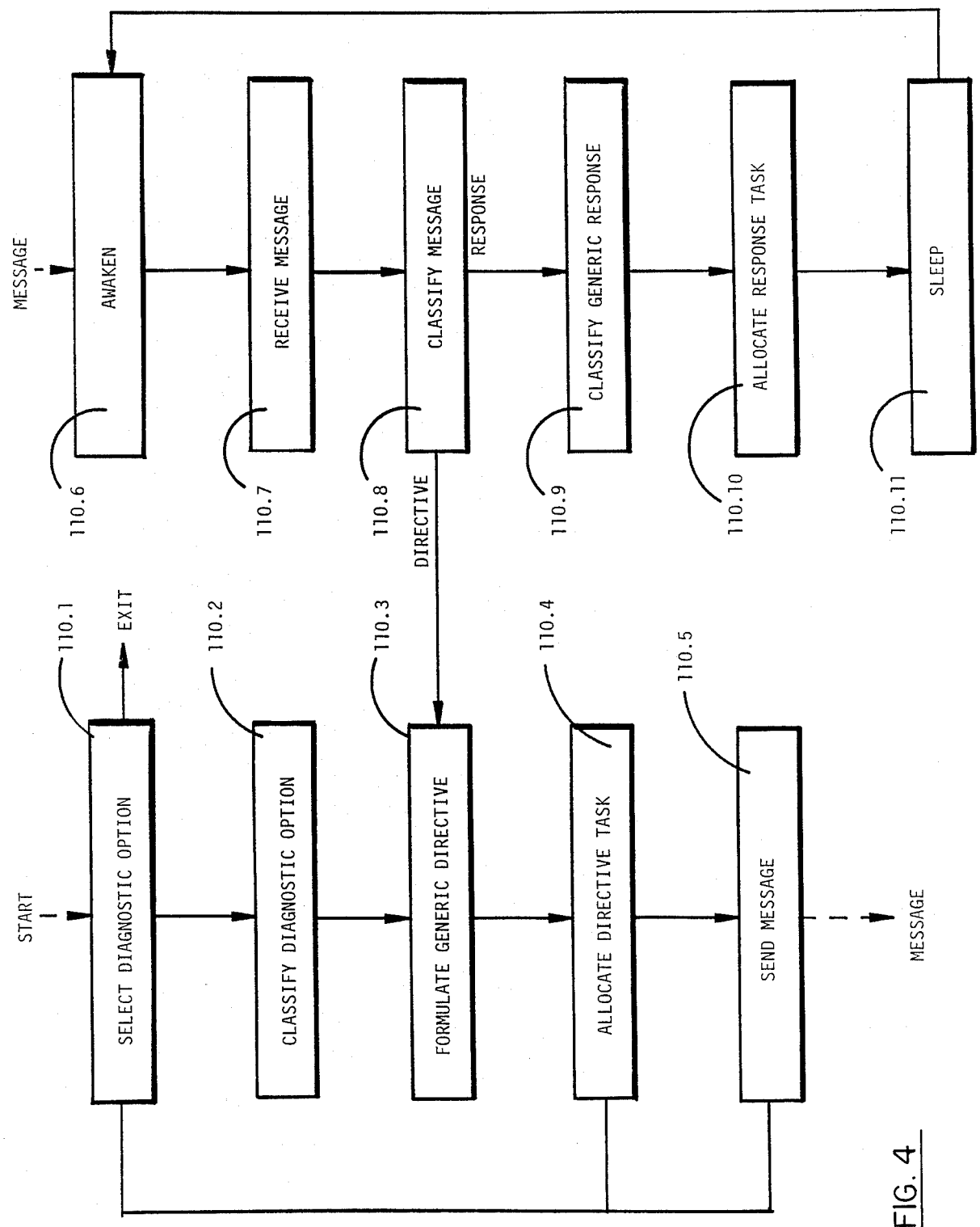
FIG. 4 shows the steps in the Control and Tasking Algorithm.

Referring to FIG. 4, there is shown the overall architecture and data flow relationships for implementing the Control and Tasking Algorithm used by TASK CONTROL 110. Control of the diagnostic procedure starts in Select-Diagnostic Option (Block 110.1) with the selection of a Diagnostic option from a menu by the Diagnostician using mouse manipulations. The selected option is passed to Classify diagnostic Option (Block 110.2) where it is classified for further specific processing. Depending on the type of diagnostic option, Formulate Generic Derivative (Block 110.3) formulates a generic directive in accordance with definitions of Table 1 (FIG. 25) and Table 2 (FIG. 26). Now, the generic directive is passed to Allocate Directive Task (Block 110.4) which allocates a dynamic task to asynchronously execute the actions implied by the selected menu option. If the dynamic task is assigned to another computer/workstation, a message, comprising the generic directive, is sent by Send Message (Block 110.5) over the ETHERNET 36 (FIG. 1) to the designated computer for execution. Following allocation of the dynamic task, control is returned to Select Diagnostic Option 110.1 to await the next diagnostic option to be selected by the Diagnostician.

Another entry point to the Control and Tasking Algorithm (FIG. 4) is when TASK CONTROL 110 receives a message from another computer/workstation via ETHERNET 36. Upon receipt of a message at Awaken (Block 110.6), the algorithm is awakened via an asynchronous system trap (AST) server or similar interrupt-driven mechanism. Control is passed to Receive Message (Block 110.7) which receives the message in a buffer. Now this message is classified in Classify Message (Block 110.8); if the message is a directive, control is transferred to Formulate Generic Directive 110.3 for continued processing and if the message is a response, control is transferred to Classify Generic Response (Block 110.9). The generic response is classified by this Block 110.9 in accordance with Table 1 (FIG. 25) and Table 2 (FIG. 26). The interpreted response is passed to Allocate Response Task (Block 110.10) which allocates a dynamic task to asynchronously execute the actions implied by this response. Upon allocating the dynamic task, this Block 110.10 passes control to Sleep (Block 110.11) which closes processing related to the response and returns control to Awaken 110.6 to await the next message interrupt.

Conventional software techniques can be employed to implement the data structures and algorithms necessary to support the following requirements comprising the EVENT MANAGER 100:

GRAPHICS CONTROL 120 display control pop-up menus with mouse selection,
display string pop-up menus with keyboard inputs,
resize a window,
drag a window to new location,
reduce window to a parking icon,
produce a screen dump (hard copy),

DESIGN CONTROL 130 display hierarchical object symbolic design,
push and pop through the design hierarchy,
peek into the hierarchical depth,
pan and zoom the design,
label a node,
designate an area of interest,
designate a node of interest,
load and store the design,

STIMULI EDITOR 140 add new signal,
delete a signal,
rename a signal,
reorder the signal sequence,
define the logic state voltages and bit-time scaling,
toggle a signal level,
shift a signal transition,
insert time advance or delay,
stamp a signal pattern,
replicate a signal pattern,
display the signal set,
pan the time axis,
define the stimuli looping range,
define the sampling period,
load and store a stimuli pattern

WAVE CONTROL 150 display the waveforms in an overlaid or tiered presentation,
zoom the waveform presentation,
add a waveform-pair,
subtract a waveform-pair,
smooth a waveform,
clamp a waveform,
rename a waveform,
delete a waveform,
display point or pair attributes,
load and save a waveform,

IMAGE CONTROL 160 display an image,
enhance an image,
pan and zoom an image,
store and load an image.

SIMULATION CONTROLLER

Figure 7:
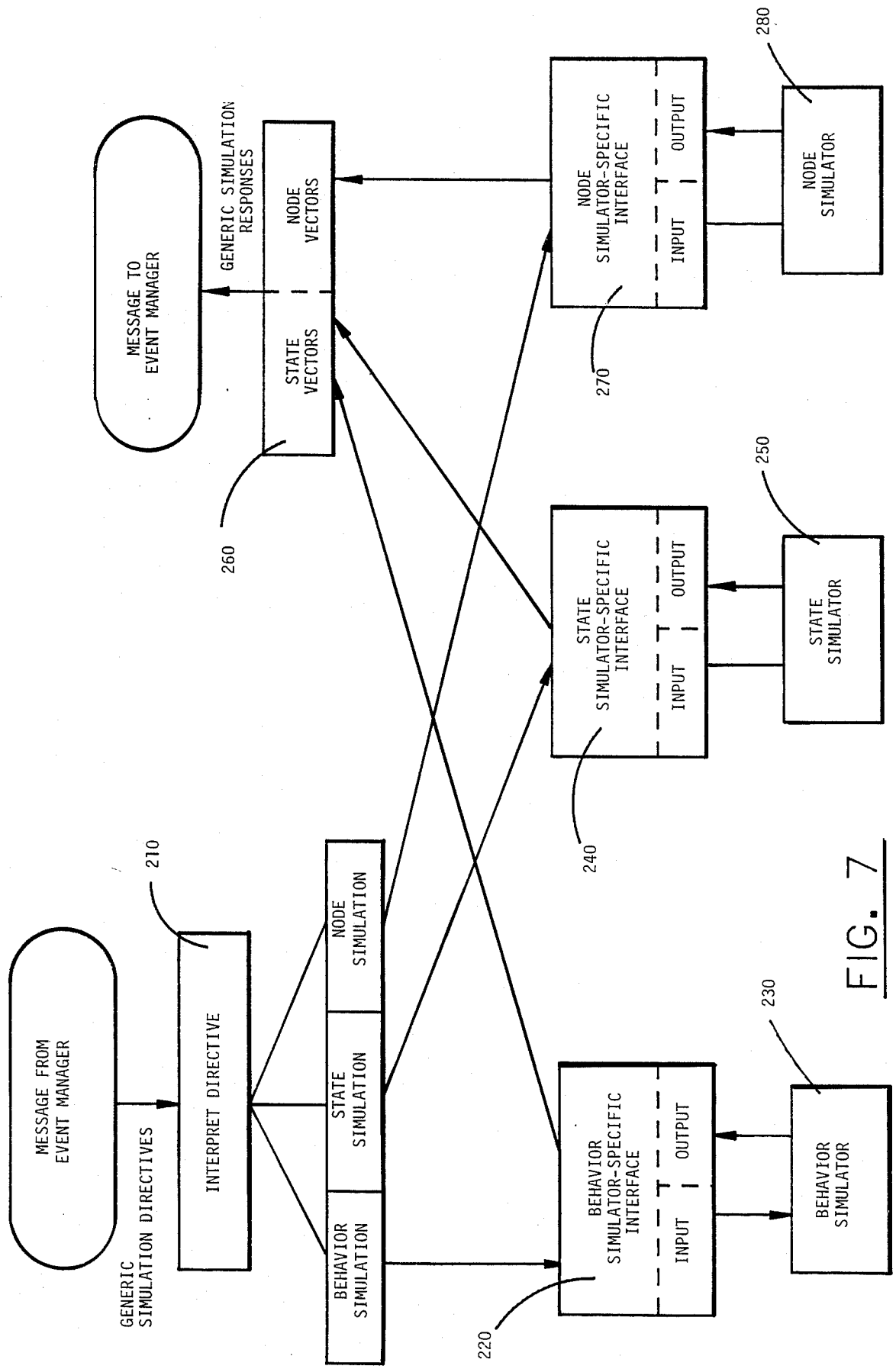
FIG. 7 shows the structure of the Simulation Controller and its generic relationship to the simulators.

The SIMULATION CONTROLLER 200 coordinates the execution of all simulation activity, with regard to predicted behavior demands, emanating from the EVENT MANAGER 100. Referring to FIG. 7, there is shown the overall architecture and data flow relationships for implementing the SIMULATION CONTROLLER incorporating the principles of this invention.

It is assumed that all simulators are hosted on an independent computer/workstation from that executing the activities of the EVENT MANAGER and the SIMULATION CONTROLLER. This apparatus configuration results in the best response time to the Diagnostician since it exploits an optimal form of concurrency. However, if the apparatus configuration only permits a common computer/workstation hosting the EVENT MANAGER, SIMULATION CONTROLLER, and the simulators, then muti-tasking is executed via time slicing between all active dynamic tasks, resulting in the degradation of response time to the Diagnostician.

Upon receiving a generic simulation directive as defined in Table 1 (FIG. 25) from the EVENT MANAGER 100, INTERPRET DIRECTIVE Block 210 interprets the level of simulation being requested. If a behavior-level simulation is being requested, the control is transferred to BEHAVIOR SIMULATOR-SPECIFIC INTERFACE Block 220. Block 220 parses the generic simulation directive and restructures the model input-output node declarations for suitable retrieving of the behavioral model from the CAD data base. The stimuli pattern is translated into the proper input state sequences for the simulator and the simulation times are set from the given sampling period. Now a dynamic simulation task is properly spawned for execution by the designated BEHAVIOR SIMULATOR represented by Block 230. Typically, Block 230 would represent the VHDL simulator hosted on a separate computer or workstation and network coupled to the computer hosting the EVENT MANAGER and SIMULATION CONTROLLER. Upon completion of the behavior-level simulation by Block 230, the dynamic simulation task is de-allocated and the behavior file is parsed for translation to the node-state-time vectors required for the generic simulation response as defined in Table 1 (FIG. 25) by Block 220. This generic simulation response is passed to STATE VECTORS Block 260 for sending to the EVENT MANAGER 100.

Figure 6:
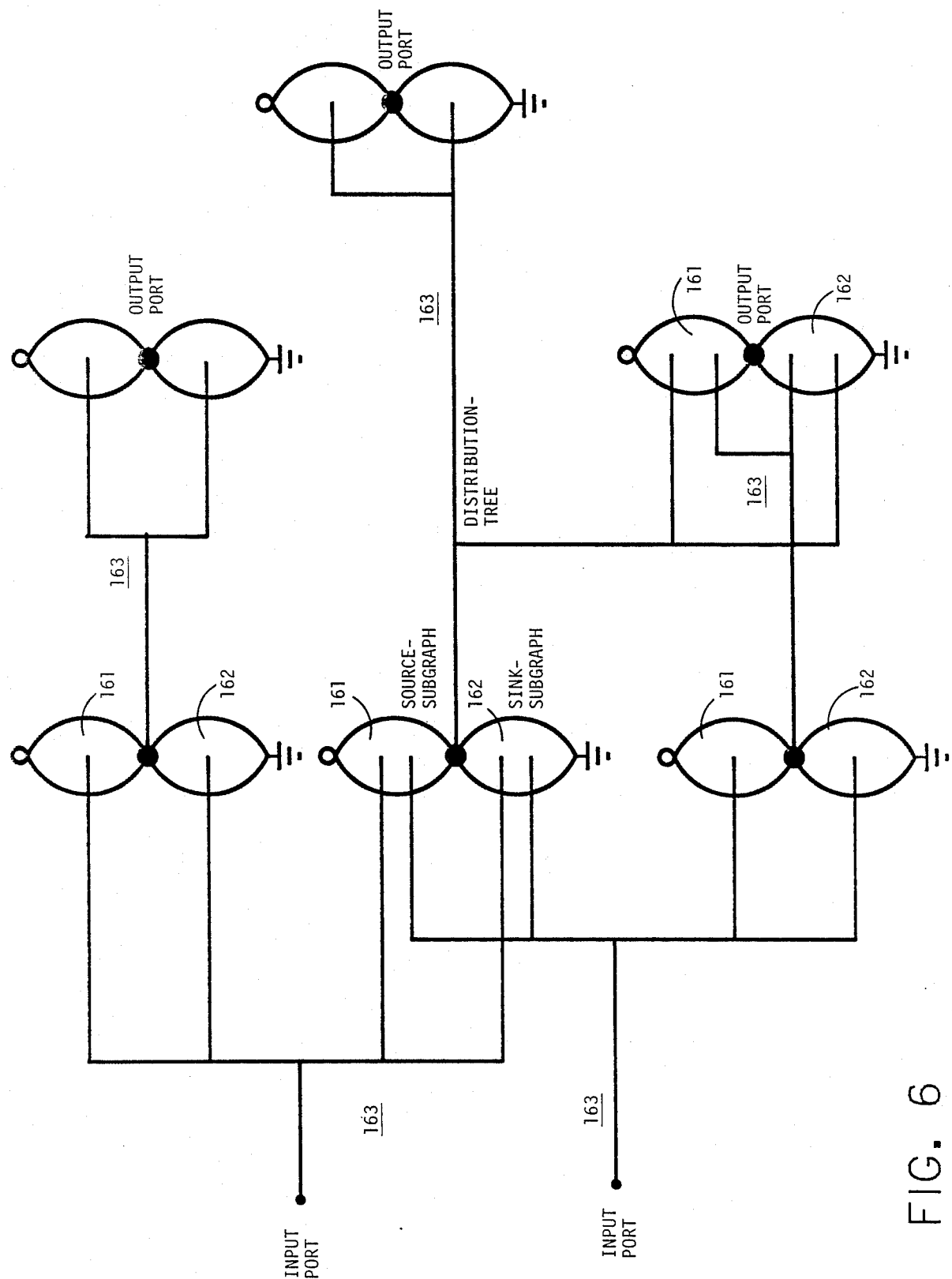
FIG. 6 illustrates the Stage-Oriented Signal Flow Graph Model for Switch-Level Simulation.

Similarly, if a state-level simulation is being requested, the control is transferred to STATE SIMULATOR-SPECIFIC INTERFACE Block 240. Block 240 parses the generic simulation directive and restructures the model input-output node declarations for suitable retrieving of the signal flow graph (switch-level) model, as illustrated in FIG. 6, from the specimen's object clustering data base. The stimuli pattern is translated into the proper input state sequences for the simulator and the simulation times are set from the given sampling period. Now a dynamic simulation task is properly spawned for execution by the designated STATE SIMULATOR represented by Block 250. Typically, Block 250 would represent the MOSSIM simulator hosted on a separate computer/workstation and network coupled to the computer hosting the EVENT MANAGER and SIMULATION CONTROLLER. Upon completion of the state-level simulation by Block 250, the dynamic simulation task is de-allocated and the behavior file is parsed for translation to the node-state-time vectors required for the generic simulation response by Block 240. This generic simulation response is passed to Block 260 for sending to the EVENT MANAGER 100.

Figure 5:
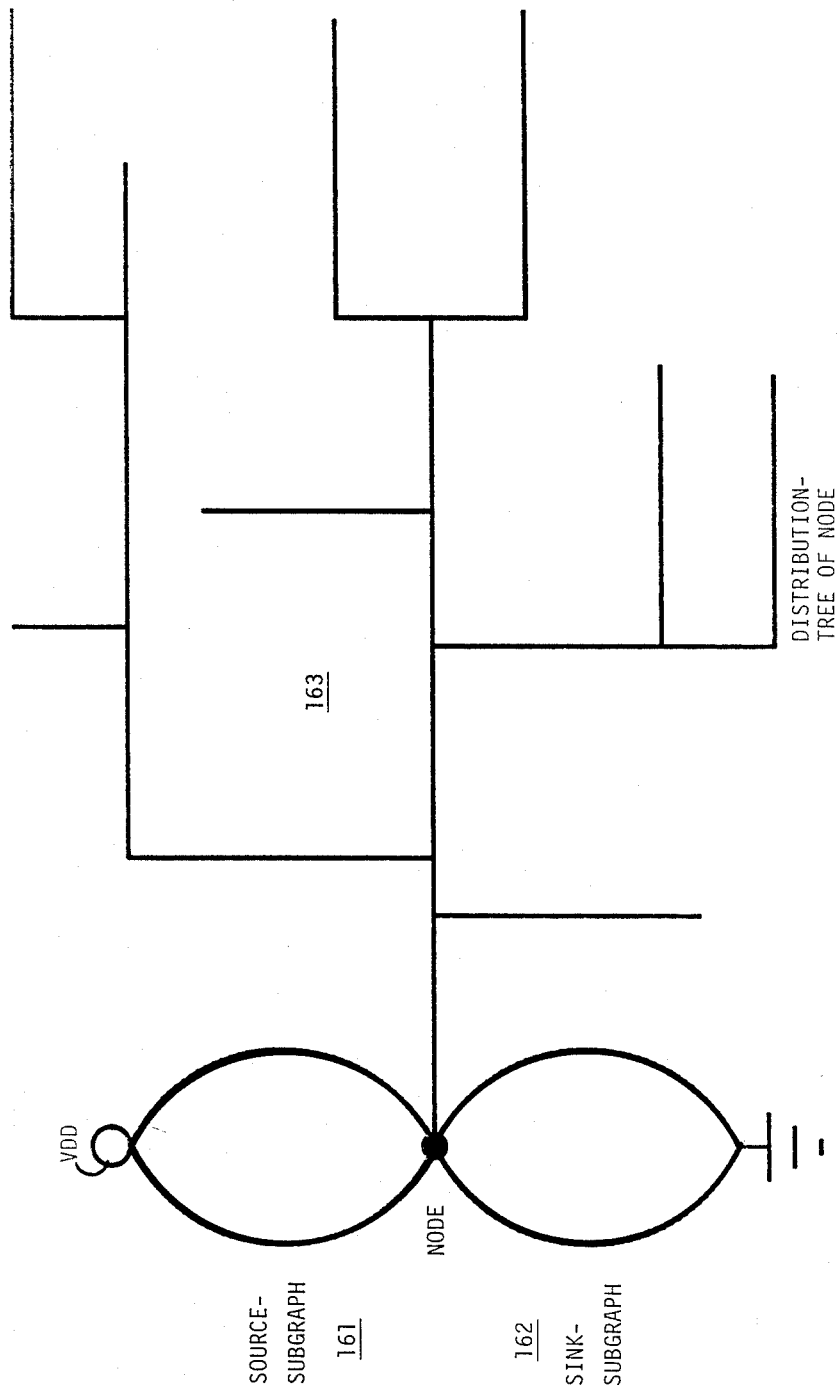
FIG. 5 illustrates the Stage Model for Circuit Analysis.

Similarly, if a node-level simulation is being requested, the control is transferred to Block 270. Block 270 parses the generic simulation directive and restructures the model input-output node declarations for suitable retrieving of the nodal model, as illustrated in FIG. 5, represented as a source subgraph 161, sink subgraph 162, and distribution tree 163, and derived from the specimen's object clustering data base. The stimuli pattern is translated into the proper input waveforms for the simulator and the simulation times are set from the given sampling period. Now a dynamic simulation task is properly spawned for execution by the designated node-level simulator represented by NODE SIMULATOR Block 280 (FIG. 7). Typically, Block 280 would represent the SPICE circuit simulator hosted on a separate computer/workstation and network coupled to th computer/workstation hosting the EVENT MANAGER and SIMULATION CONTROLLER. Upon completion of the node-level simulation by Block 280, the dynamic simulation task is de-allocated and the behavior file is parsed for translation to the voltage-time vectors required for the generic simulation response by Block 270. This generic simulation response is passed to Block 260 for sending to the EVENT MANAGER 100.

OBJECT CLUSTERING TRANSLATOR

For purposes of predicting behavior (nodal waveforms or state maps (images)) used for comparative behavioral presentations to the Diagnostician, the specimen's design is considered constant or "frozen". This means the circuit topologies represented in the specimen's design are unchanging. It is these circuit topologies that underlie the models used to predict nodal behavior with circuit analysis and/or switch-level simulation techniques. Hence, the design-derived models are constant for the entire diagnostic examination. Only the modeling parameters are changing; i.e., supply voltage levels, input waveforms, or temperature.

The specimen's design is perceived from an object-oriented perspective. That is, the design can be represented symbolically as a set of technology independent objects representing the design's hierarchy, modularity, and regularity. Similarly, a set of technology dependent objects can represent the buildable structures permitted by the selected process/foundry.

Figure 8:
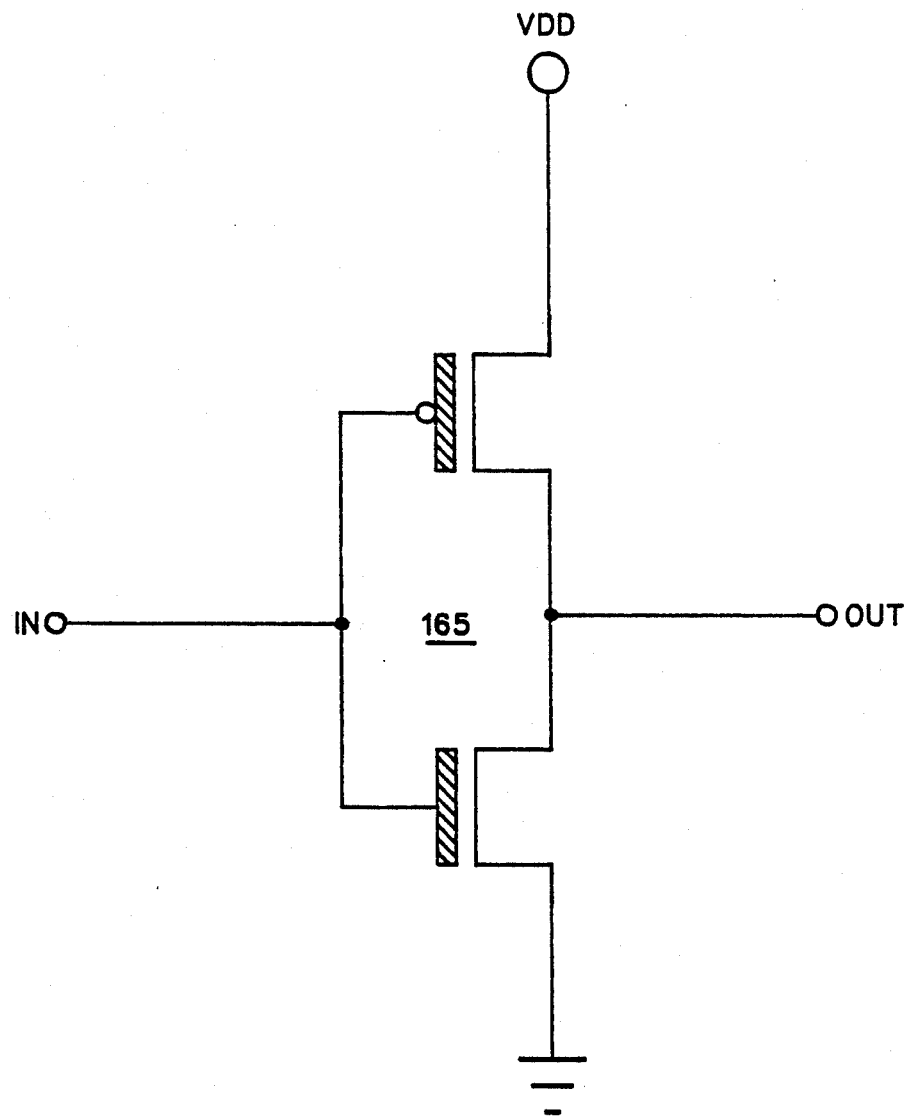
FIG. 8 illustrates a Circuit Schematic of a CMOS Inverter.

Referring to FIG. 8, there is shown a simple CMOS inverter 165 which will be used to illustrate these object-oriented symbolic design principles.

Figure 9:
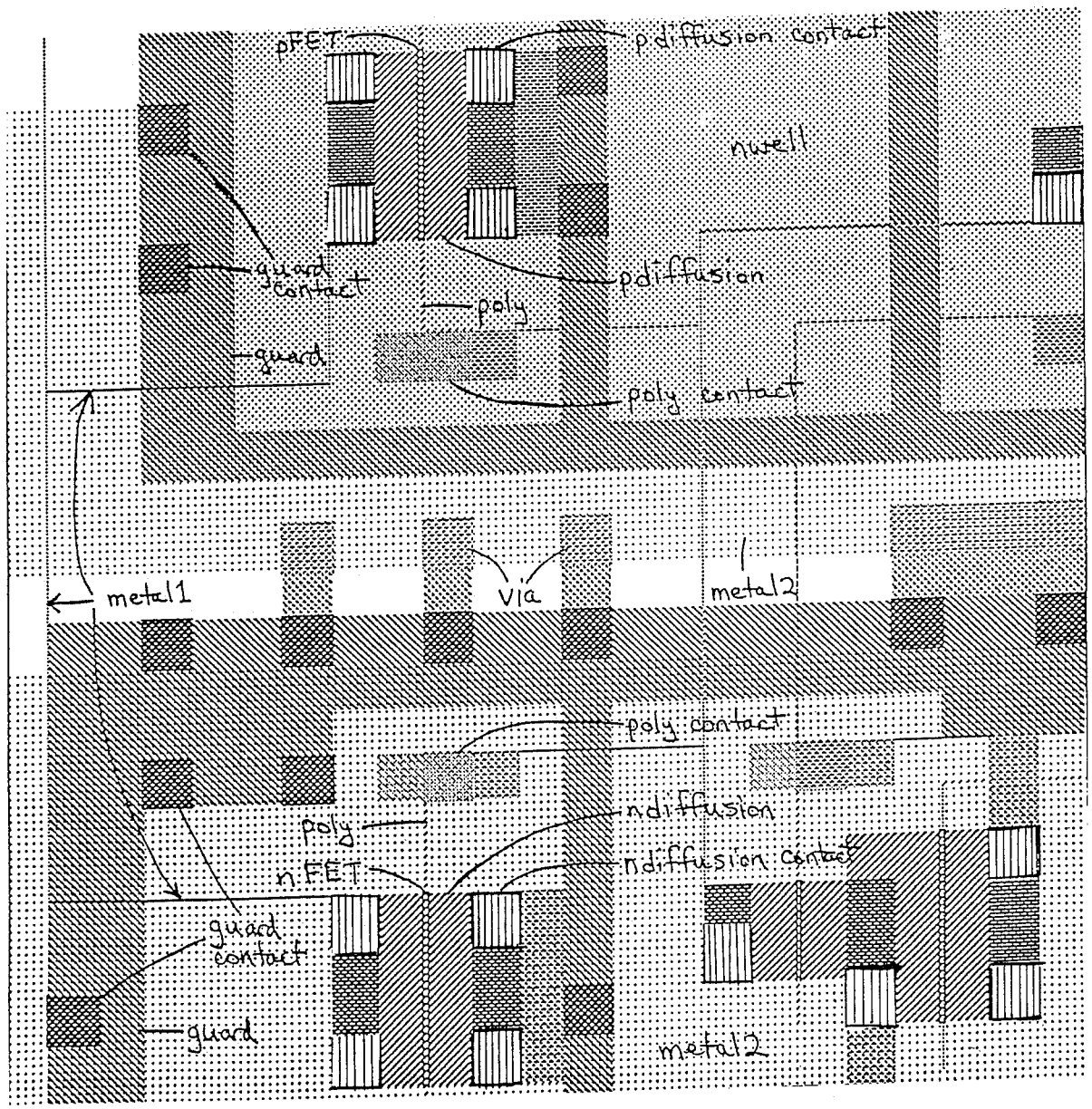
FIG. 9 illustrates the Object Symbolic design Representation of the CMOS Inverter.

Referring to FIG. 9, there is shown the various technology dependent objects required for a typical CMOS inverter; i.e., various conductors, contacts, and transistor objects.

Figure 10:
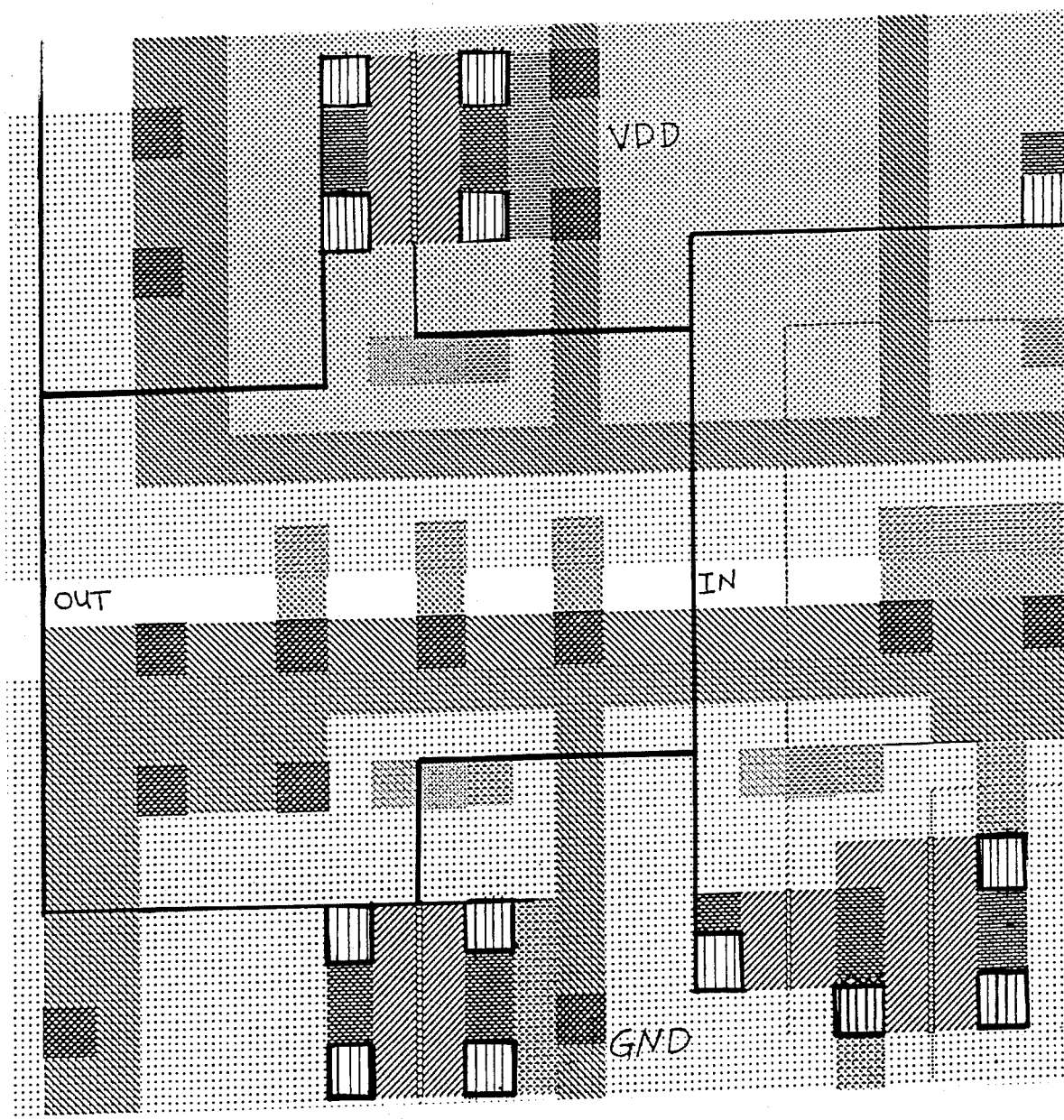
FIG. 10 illustrates the Node Labels of the CMOS Inverter.
Figure 11:
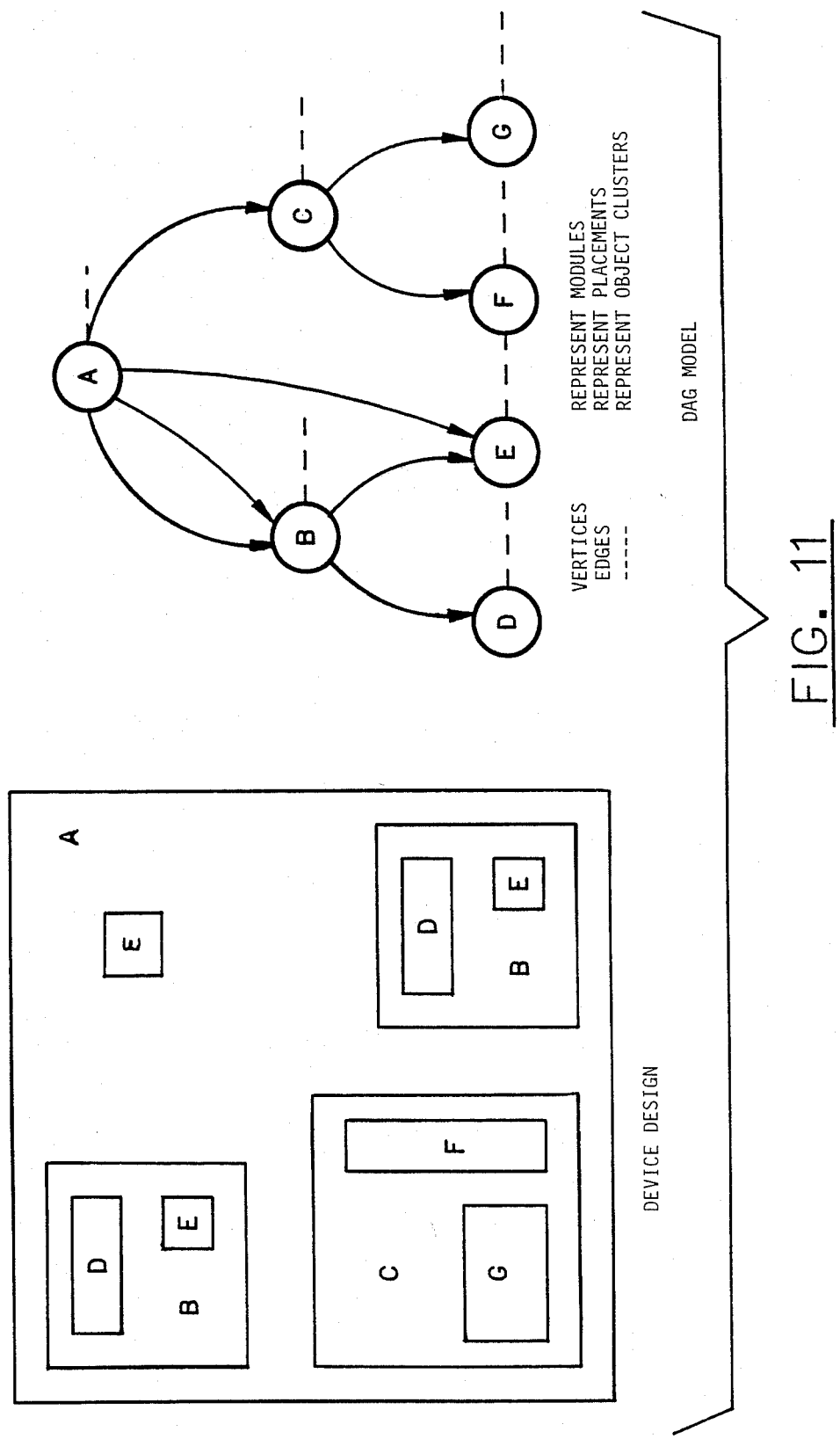
FIG. 11 shows the DAG Model of VLSI Design Hierarchy.

Referring to FIG. 10, there is shown the input, output, and supply node labels, related to the CMOS inverter circuit schematic shown in FIG. 8, required for node topology extraction underlying the simulation modeling activities. The structure of the specimen's design is symbolically represented by using a directed acyclic graph (DAG) model (FIG. 11). Referring to FIG. 11, there is shown the relationship between the specimen's design structure, i.e., hierarchy, modularity, and regularity, and the DAG model. These concepts of managing design complexity result in the set of technology independent objects such as modules or cells, interconnection ports or points, and placements or instantiations. This concept of symbolically representing the specimen's design with objects results in process/foundry independence of data structure and node extraction-modeling algorithms.

Figure 12:
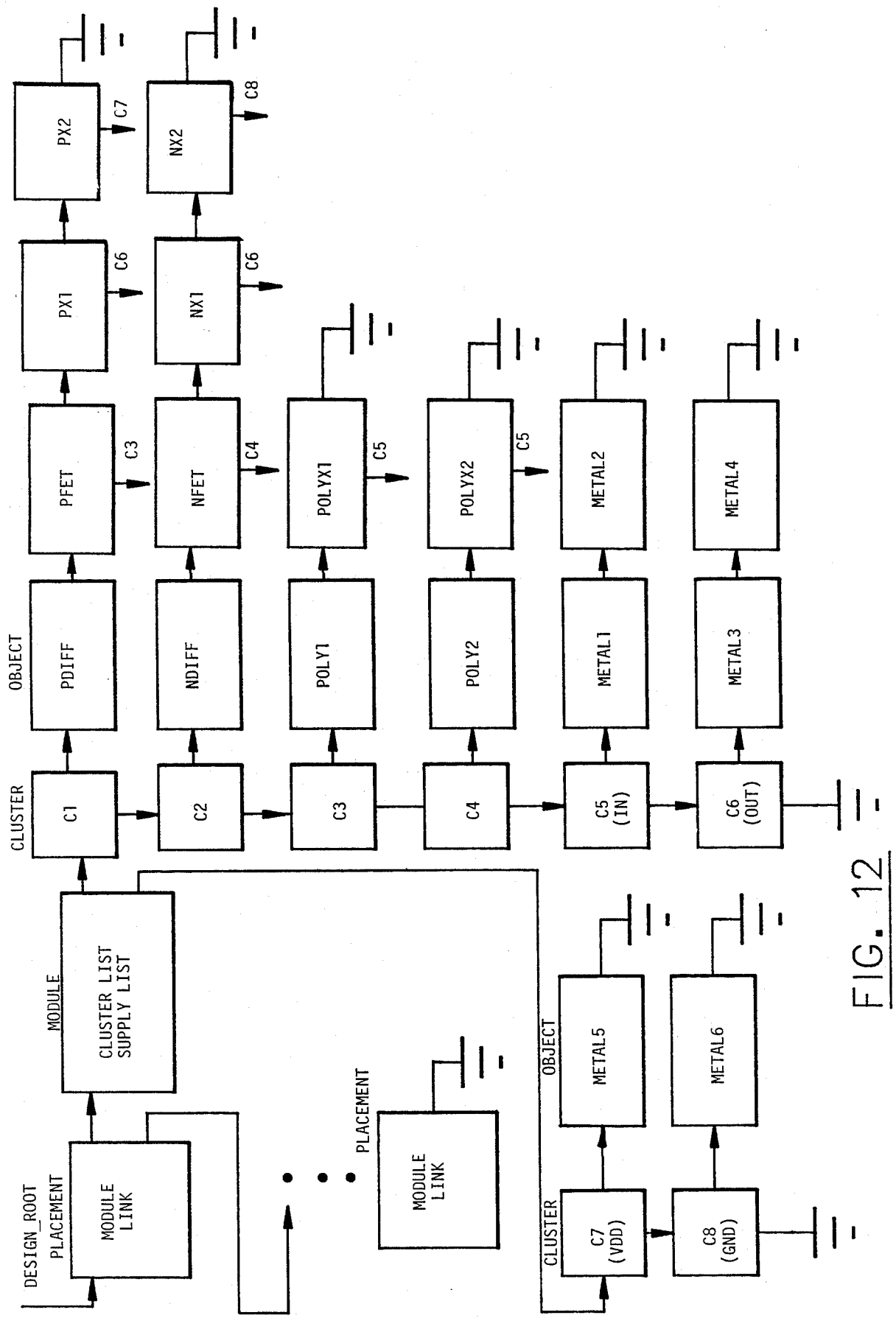
FIG. 12 shows the Object Clustering Data Structure.

To fully exploit this constant model concept, an object-oriented data structure, defined in FIG. 12, is employed that accelerates model development required to support simulation activities within the interactive diagnostic methodology. Each box depicts an object and its properties of object type and extent as related to its placement coordinates in a symbolic grid system. This data structure will be referred to as "object clustering" since design-related objects are bound (linked) into clusters based on nodal continuity or "connectedness" rules. This object clustering data structure can interface CAD systems based on symbolic-oriented or mask-oriented, e.g., Caltech Intermediate Form (CIF), layout descriptions used to design the specimen undergoing diagnostic examination.

Figure 13:
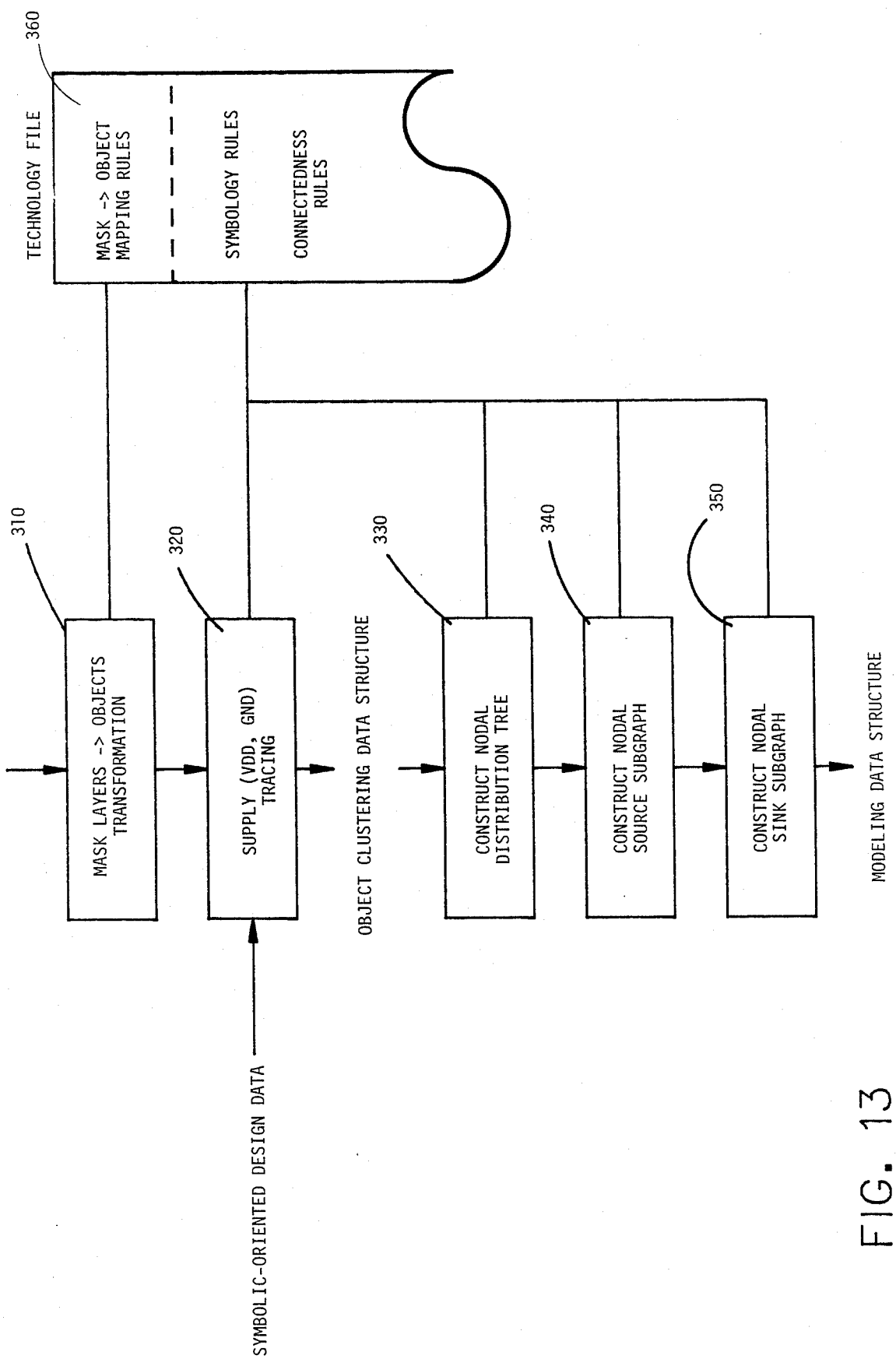
FIG. 13 illustrates the Object Clustering/Modeling Algorithm.

Referring to FIG. 13, there is shown the algorithm for implementing the Object Clustering Translator incorporating the principles of this invention. It can accept a specimen's design in either a symbolic-oriented or mask-oriented representation and it generates the object clustering data structure detailed in FIG. 12 upon which all model construction underlying simulation activities is based. If a mask-oriented (CIF) representation of the specimen's design is available, it is processed by MASK LAYERS-OBJECTS TRANSFORMATION Block 310 using the mask layer-to-object mapping rules residing in a Technology File (Block 360). Block 310 produces a data structure in accordance with the symbology rules, also residing in the Technology File 360, representing the specific process used to fabricate the specimen which is passed on to SUPPLY (VDD, GND) TRACING Block 320. If a symbolic-oriented representation of the specimen's design is available, it is inputted to Block 320 for processing in accordance with its symbology rules also residing in the Technology File 360. Block 320 traces the supply (VDD, GND) distribution system in accordance with the connectedness rules residing in the Technology File 360. Now, control is passed to CONSTRUCT NODAL DISTRIBUTION TREE Block 330 which uses the connectedness rules, residing in the Technology File 360, to construct all the nodal distribution trees in the specimen's design. Now, control is transferred to CONSTRUCT NODAL SOURCE SUBGRAPH Block 340 which uses the connectedness rules to construct all the nodal source subgraphs in the specimen's design. In a similar manner, control is transferred to CONSTRUCT NODAL SINK SUBGRAPH Block 350 which uses the connectedness rules to construct all the nodal sink subgraphs in the specimen's design.

The tracing of the specimen's supply distribution system, performed in Block 320, and the nodal distribution trees, performed in Block 330, is very simple. The object clustering data structure has the primary linkages already established. Only the nonsupply contacts need to be linked by a simple object-pair intersection algorithm, as discussed in the following paragraph.

Figure 14:
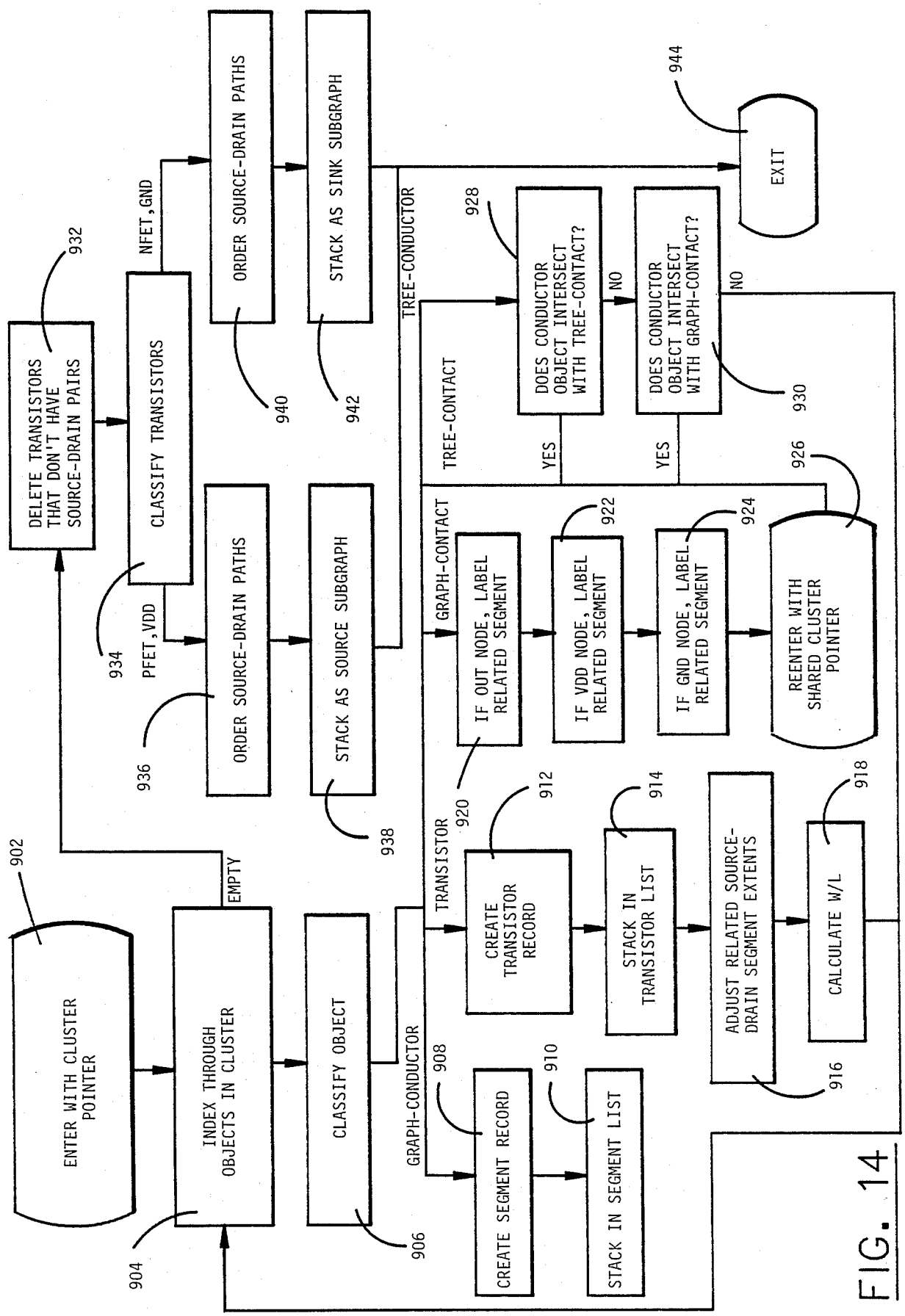
FIG. 14 illustrates the Node Extraction Algorithm.

The topological tracing of the source subgraph performed in Block 340 and the sink subgraph performed in Block 350 is in accordance with the node extraction algorithm defined in FIG. 14. The continuity relationship between objects is defined by the connectedness rules residing in the technology file Block 360 controlling a very simple object-pair intersection algorithm. The reduction of the initial transistor list is as defined in FIG. 15. All this topological tracing results in the construction of the transistor lists, detailed in FIG. 15, that now contains object and relational linkages to allow rapid model construction in support of circuit analyses and switch-level simulations as demanded by the Diagnostician's planned tactical needs for predicted waveforms.

NODE EXTRACTION ALGORITHM

As previously discussed, the Node Extraction Algorithm (FIG. 14) produces the source and sink subgraphs (See FIG. 5) which are represented as transistor lists (see FIG. 15) and the distribution tree (see FIG. 5) which is represented as an object cluster list (see FIG. 12). The simulation models for switch-level simulation and circuit analysis are based on this common stage (isolated node) modeling concept (see FIG. 5). For diagnostic purposes, these models are considered constant since the circuit topologies cannot change. Therefore, the stage models for all interested nodes can be created by the Object Clustering Translator 300 (FIG. 2) prior to diagnostic examination of the specimen.

Referring to FIG. 14, there is shown the Node Extraction Algorithm incorporating the simulation modeling principles of this invention. Nodes of interest can be defined by designating their name or by pointing to a conductor site within the symbolic design display using the mouse 50. The related object cluster is identified by either relating its name with the given name or by the designated mouse site intersecting a member object's extent. The algorithm assumes that the object order in each cluster list is such that all conductor type objects are first, then followed by all transistor type objects, and then all contact type objects. This object order minimizes the time required to execute the underlying object-pair extent intersection algorithm. Linking the objects associated with the supply (VDD, GND) distribution system into a separate list, as shown in FIG. 12, further reduces the dimensionality of the object-pair intersection algorithm and correspondingly reduces computer time.

Thus, the Node Extraction Algorithm starts in Block 902 (FIG. 14) with the seed object cluster pointer related to the designated node of interest. This seeded object cluster is the distribution tree of the stage model (see FIG. 5). Now a control loop indexes through all objects comprising the cluster which is performed in Block 904. The indexed object is classified in Block 906 in accordance with rules residing in a Technology File. Each technology dependent object belongs to a "connectedness" class as a means of achieving process/foundry independence for the Node Extraction Algorithm. The object classes controlling the construction of the source and sink subgraphs are: Graph-Conductor (FIG. 14), Graph-Contact, and Transistor. Similarly, the object classes controlling the construction of the distribution trees are: Tree-Conductor, and Tree-Contact. These object classes thus represent the potential control branching available to Classify Object Block 906.

If the indexed object is of the Graph-Conductor class, then control is transferred from Block 906 to Create Segment record Block 908. Block 908 creates a segment record which contains the object extent and type (p-diffusion or n-diffusion). Now Block Stack in Segment List 910 threads this segment record into the segment list and returns control to Index through objects in cluster Block 904.

If the indexed object is of the Transistor class, then control is transferred from Block 906 to Create Transistor record Block 912. Block 912 creates a transistor record derived from the indexed object which contains its source and drain node pointers, W/L parameters, and its type (pFET or nFET). Stack in Transistor list Block 914 threads this transistor record into the transistor list. Adjusted related source-drain Segment extent Block 916 finds the related diffusion segment in the segment list and adjusts the transistor's source and drain (diffusion) segment extents in the transistor record. Calculate W/L Block 918 calculates the transistor's junction width and length parameters and inserts them in the transistor record and returns control to block 904.

If the indexed object is of the Graph-Contact class, then control is transferred from Block 906 to if OUT node, label related SEGMENT Block 920. Block 920 checks if the mated contact conductor is tied to a distribution tree, and if it is, designates the related segments as an "OUT" node in the appropriate transistor records. If VDD node, label related SEGMENT Block 922 checks if the mated contact conductor is labeled as "VDD", and if it is, designates the related segments as a "VDD" node in the appropriate transistor records. If GND node, label related SEGMENT Block 924 checks if the mated contact conductor is labeled as "GND", and if it is, designates the related segments as a "GND" node in the appropriate transistor records. The Block 926, labeled reENTER with shared cluster pointer, passes control to Block 902 which acts as a recursive reentry of the Node Extraction Algorithm with the mated contact conductor's cluster pointer.

If the indexed object is of the TREE-CONTACT class, then control is transferred from Block 906 to Block 926. Block 926 passes control to Block 902 which acts as a recursive reentry of the Node Extraction Algorithm with the mated contact conductor's cluster pointer.

If the indexed object is of the TREE-CONDUCTOR class, then control is transferred from Block 906 to Does conductor object intersect with TREE-CONTACT? Block 928. Block 928 examines all clusters to determine if it intersects with any other contact object classified as a TREE-CONTACT. If a proper contact intersection exists, control is transferred to Block 926 for recursive reentry of the algorithm. If no proper contact intersection exits, then control is transferred to Does conductor object intersect with GRAPH-CONTACT? Block 930. Similarly, Block 930 examines all clusters to determine if it intersects with any other contact object classified as a GRAPH-CONTACT. If a proper contact intersection exits, control is transferred to Block 926 for recursive reentry of the algorithm. If no proper contact intersection exits, then control is transferred to Block 904.

Figure 15:
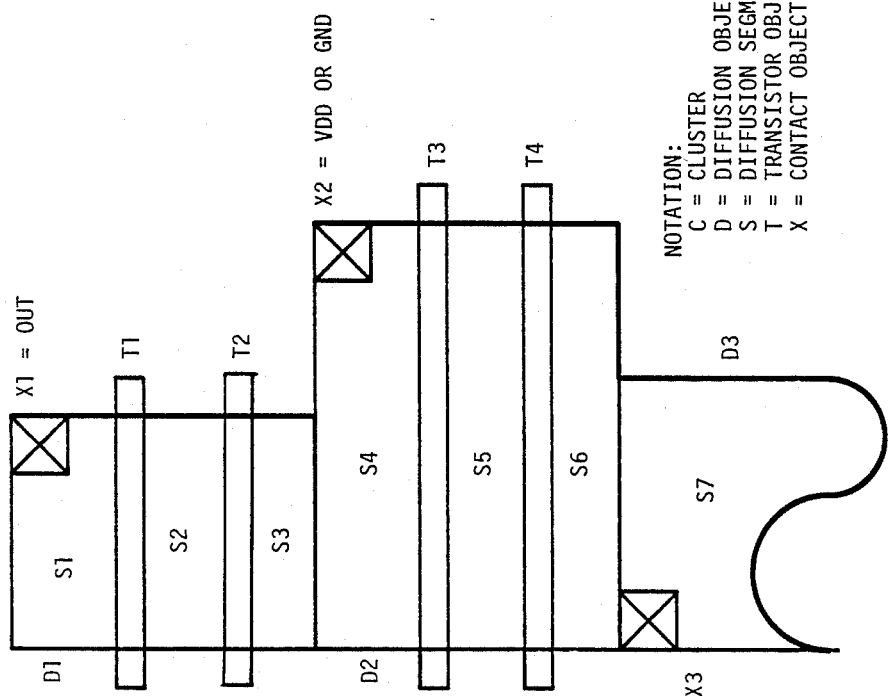
FIG. 15 shows the Transistor List Reduction Scheme.

Upon the final recursive return, in which there are no more indexed objects, Block 904 transfers control to Delete transistors that don't have source-drain pairs Block 932. Block 932 examines the transistor list and deletes any transistors that don't have paired source-drain nodes, as indicated by identical segment pointers. This transistor list reduction scheme is illustrated in FIG. 15. Then, control is passed to Classify transistors Block 934 which classifies the transistor list as a source controlling circuit or as a sink controlling circuit. If it is source controlling, then control is transferred to Order source-drain paths Block 936 which orders the p-type transistor source-drain nodes for electron flow. Then, control is transferred to Stack as Source Subgraph Block 938 which stacks the Transistor List as a source subgraph and exits the algorithm through EXIT Block 944. However, if Block 934 identifies a sink controlling circuit, then control is transferred to Order source-drain paths Block 940 which orders the n-type transistor source-drain nodes for electron flow. Then, control is transferred to Stack as Sink Subgraph Block 942 which stacks the Transistor List as a sink subgraph and exits the algorithm through EXIT Block 944.

TEST TRANSLATOR

The TEST TRANSLATOR (FIG. 2, Block 400) is used to import test (stimuli/response) patterns for use as a baseline starting point in the diagnosis of the specimen. Since the source of this test pattern (often referred to as "TEST VECTORS") may come from a variety of sources, many different data formats are to be expected. A TEST GENERATOR (FIG. 2, Block 605) may reside in the native CAD system used to originally design the specimen, and thus some test patterns may exist prior to detailed diagnostic examination.

Figure 16:
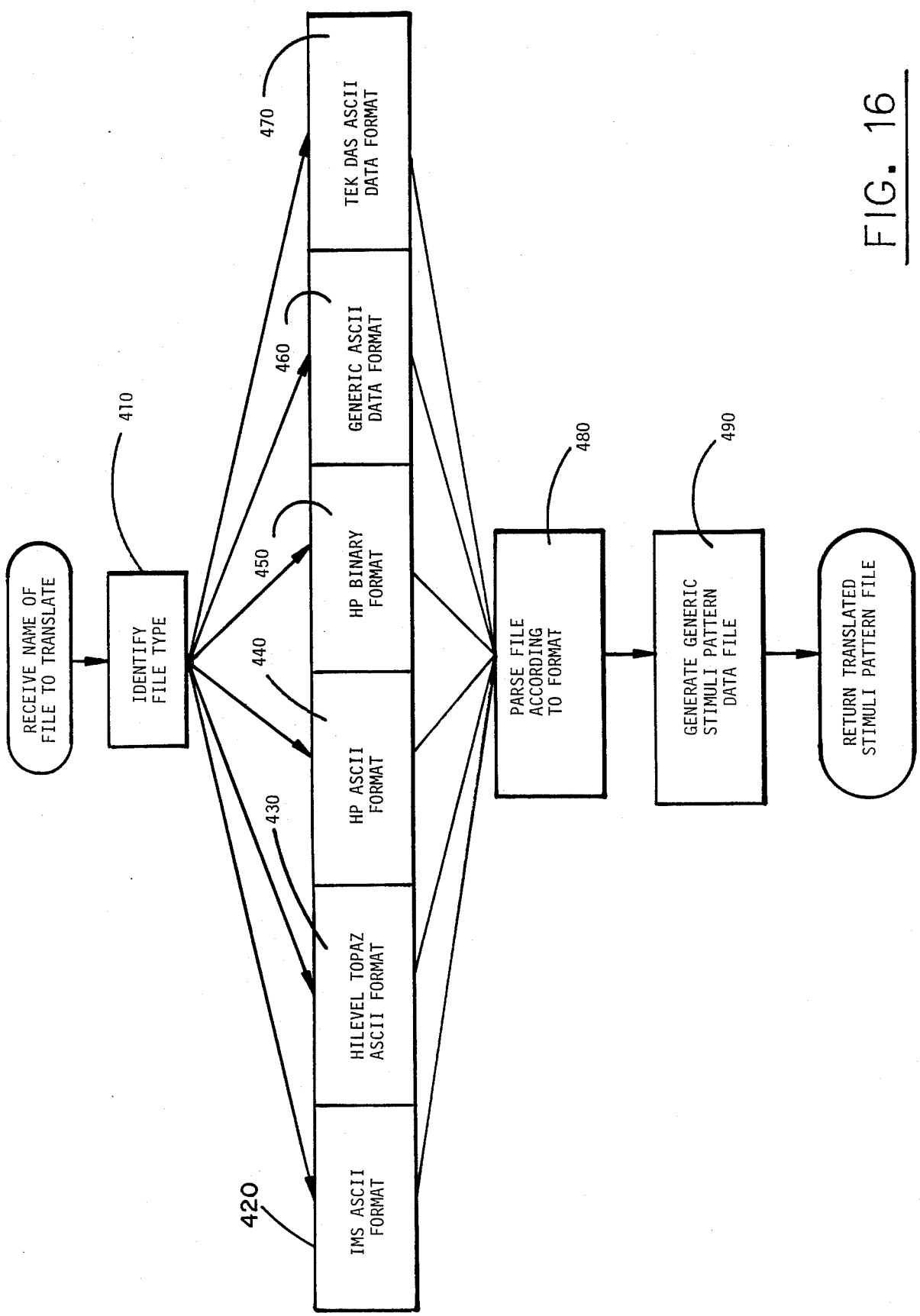
FIG. 16 shows the Test Translator Block Diagram.

Referring to FIG. 16, there is shown the overall architecture and data flow relationships for implementing the TEST TRANSLATOR incorporating the principles of this invention. The name of a file containing the (foreign) test pattern is passed to the TEST TRANSLATOR and in Block 410, the file name extension is parsed to determine the type of file format. For instance, a file named "TEST.IMS" would be identified as an IMS format file, and would be passed to the file parser PARSE FILL ACCORDING TO FORMAT Block 480 along with the IMS format definition selected in IMS ASCII FORMAT Block 420.

In Block 480, the Test File Parser, the input foreign test file data is examined, record by record, and the data is translated into the generic stimuli pattern data format, as defined in Chart 1 (FIG. 26). Typically, an ASCII test pattern file consists of lines of text characters, one line for each bit-time, (or "TEST VECTOR" or "PATTERN GENERATOR WORD") with a direct correspondence between the character in a particular column position (either in binary 0-1, octal 0-7, hexadecimal 0-F, or other number format) and a particular signal line or lines to be outputted from the stimuli generator. The generic stimuli pattern format (see Chart 1, FIG. 26) consists of a list of signal records, each containing an PSCII signal name and an array of 2-bit logic state representations (representing LOGIC LOW, LOGIC HIGH, and DON'T CARE (undriven or tri-stated) output states). An initial header record in the generic stimuli pattern file contains floating point representations of the time base (seconds per bit time), Logic High Level (Volts), Logic Low level (volts), and looping Start and Stop Times (integer bit times). This Generic Stimuli Pattern data is written to a file in FIG. 16, Block 490 GENERATE GENERIC STIMULI PATTERN DATA FILE.

INSTRUMENT CONTROLLER

The INSTRUMENT CONTROLLER 500 (FIG. 2) receives generic directives from the EVENT MANAGER 100, interprets these directives, and executes them. Applicable generic directives and responses are listed in Table 2 (FIG. 26). Operating within the INSTRUMENT CONTROLLER 500, apparatus-dependent software modules convert the generic measurement directives into the apparatus-specific numerical control language needed to control the particular digital word generator, beam-prober, and any needed accessory equipment, such as power supplies, stage drive automation, or digital image framestore that might be required to provide the necessary specimen exercising and data acquisition functions.

Figure 17:
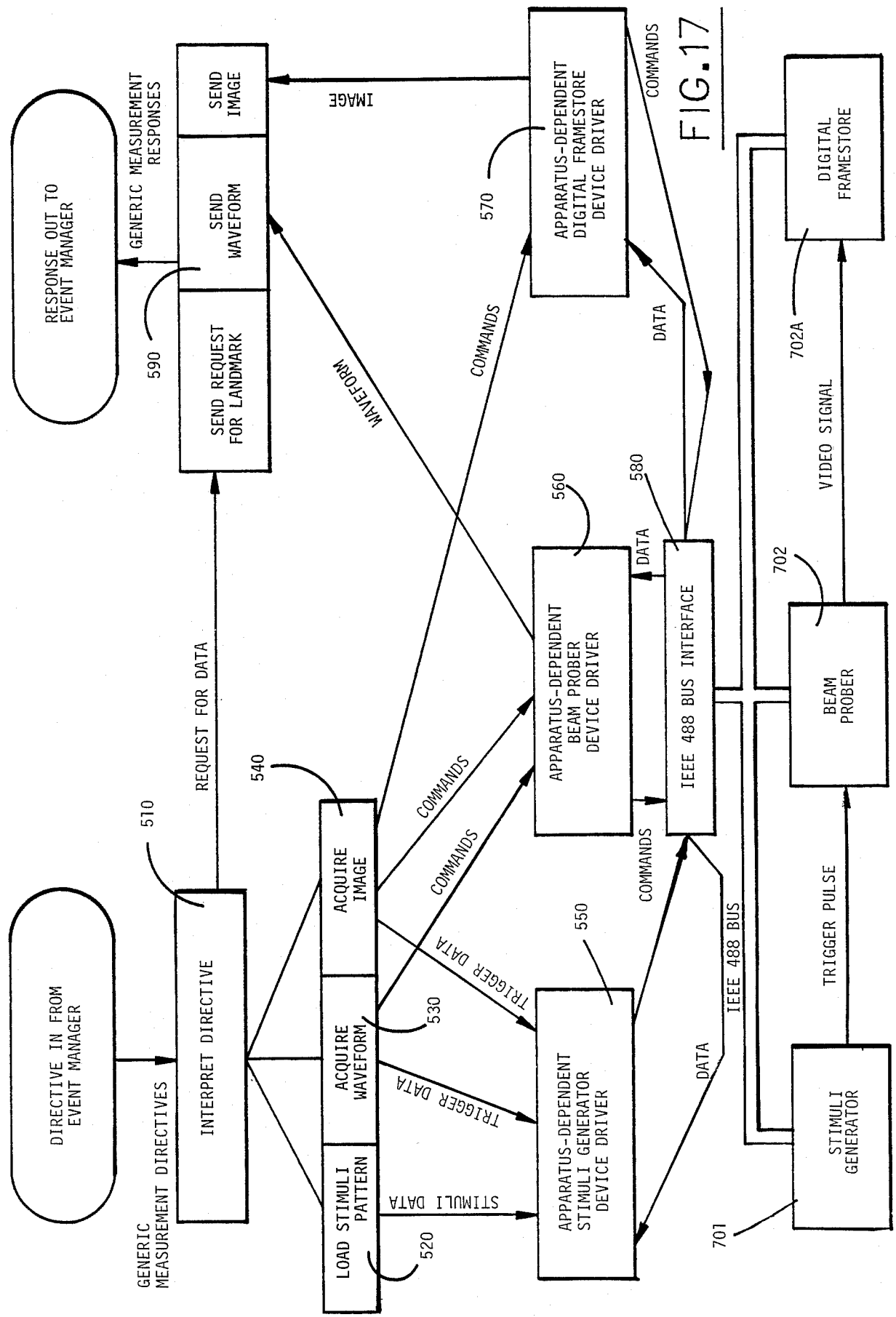
FIG. 17 shows the Instrument Controller Block Diagram.

Referring to FIG. 17, there is shown the overall architecture and data flow relationships for implementing the INSTRUMENT CONTROLLER 500 of FIG. 2, incorporating the principles of this invention. INTERPRET DIRECTIVE Block 510 interprets the messages coming from the EVENT MANAGER 100 (FIG. 2) and initiates the particular dynamic tasks required to satisfy the generic directives, as portrayed in LOAD STIMULI PATTERN Block 520, ACQUIRE WAVEFORM Block 530, and ACQUIRE IMAGE 540.

Figure 18:
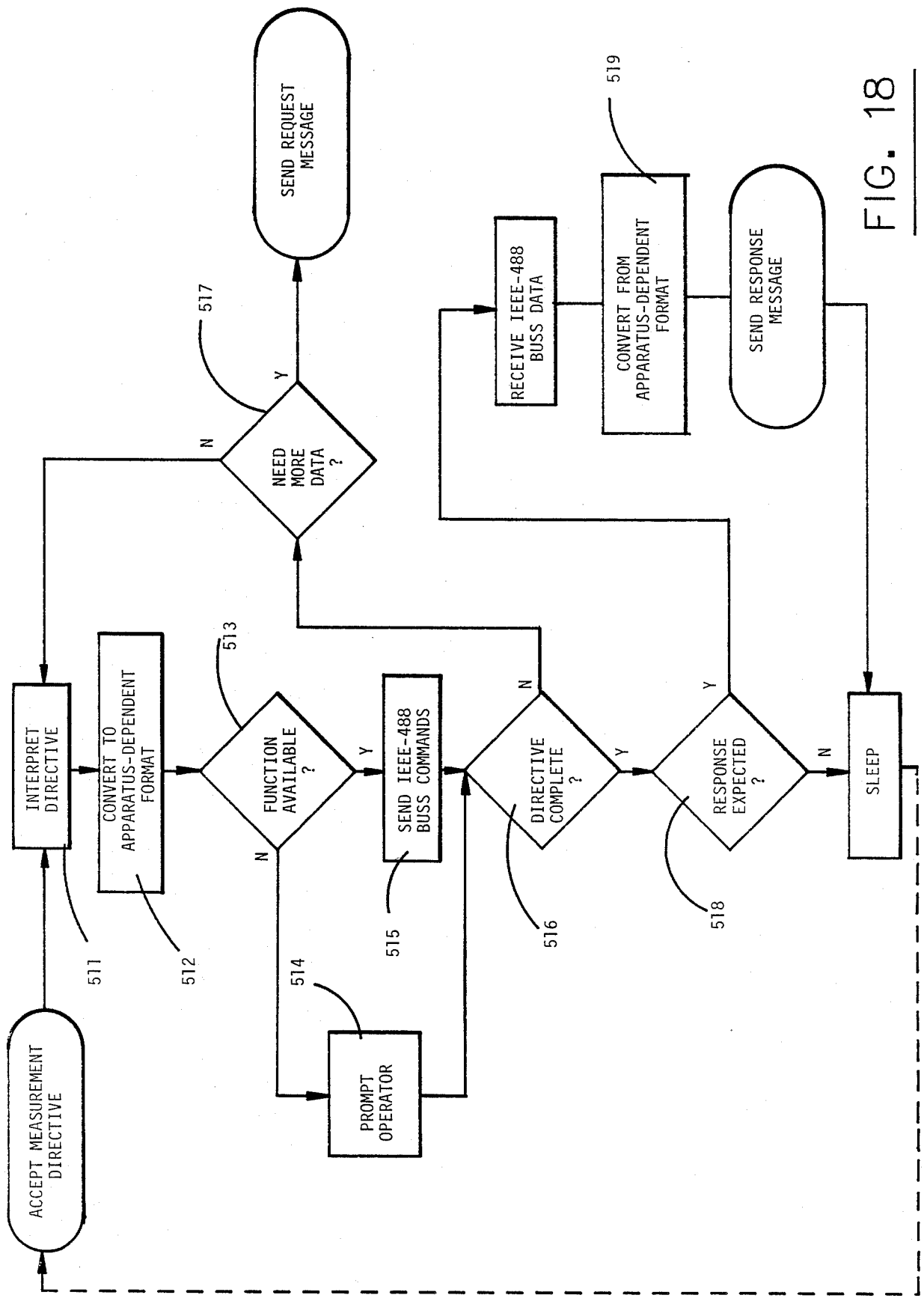
FIG. 18 shows the Instrument Controller Flow Diagram.

Referring to FIG. 18, there is shown the data flow with respect to the INSTRUMENT CONTROLLER 500 (FIG. 2). INTERPRET DIRECTIVE Block 511 accepts the generic measurement directives and, depending on the specific functionality available via the apparatus-dependent device drivers, directs the flow of instructions to properly satisfy the directive. CONVERT TO APPARATUS-DEPENDENT-FORMAT Block 512 aids this process by using information received from the apparatus drivers to decide what instructions should be given to each piece of apparatus. For instance, to implement an "ACQUIRE WAVEFORM" directive, first the beam probe (electron beam, laser, or whatever) must be positioned on the circuit node of interest. Some BEAM PROBERS 702 (FIG. 17), such as the Mitsui laser prober, e.g., 39 (FIG. 1), known as the DATA*PROBE, can do this directly and absolutely, using a laser interferometer stage, other systems, such as the LINTECH, can go to any position once the scaling, rotation, and positional offsets are determined, but most currently available systems will require crude, perhaps manually executed stage motions and position re-calibrations to access arbitrary node locations on the specimen.

An "ACQUIRE WAVEFORM" directive will require the transmittal of instructions to the SIMULI GENERATOR 701 (FIG. 2) and possibly some instructions to a stage controller (not shown) and/or displayed instructions to the Diagnostician, (to turn a knob or throw a switch for instance) as well as to the Beam Prober apparatus. Decisions as to whether to prompt the Diagnostician to perform some non-automated function are made in FUNCTION AVAILABLE Block 513. If human intervention is required, PROMPT OPERATOR Block 514 handles it by displaying instructions on a computer/workstation display and waits for confirmation of successful completion of the instructions as might be indicated by the Diagnostician typing in "yes" in response to the command "Type 'yes' when the knob is in position 'B'".

In most cases the apparatus will be able to perform an operation, so SEND IEEE-488 BUS COMMANDS Block 515 acts by sending the appropriate numerical control language commands to the indicated apparatus on the IEEE 488 Bus 40 (FIG. 1). Since most directives require sequence-s of operations, DIRECTIVE COMPLETE Block 516 tests for the state of completion of the desired directive and passes control to either NEED MORE DATA Block 517 or RESPONSE EXPECTED Block 518. Block 517 tests the need for additional data, such as a landmark site for with that of the specimen's Symbolic Design coordinate system or the location of a nearby grounded conductor for noise subtraction purposes. If additional data is needed, a request message can be send to the EVENT MANAGER 100 (FIG. 2). When the needed data arrives via Block 511 (FIG. 18), the execution of the measurement algorithm can continue. At the completion of the execution of a directive, RESPONSE EXPECTED Block 518 tests to see if data should be transmitted to the EVENT MANAGER 100, e.g., a measured waveform. In such a case, CONVERT FROM APPARATUS FORMAT Block 519 receives the data coming in off the IEEE 488 bus and converts it from the apparatus-specific numerical control language format of the particular BEAM PROBER 702 to the generic response format required by the EVENT MANAGER 100.

Again referring to FIG. 17, APPARATUS-DEPENDENT STIMULI GENERATOR DEVICE DRIVER Block 520 implements the task "LOAD STIMULI PATTERN" by accepting the generic stimuli pattern data included in the measurement directive and passed via Block 510. This data is given to the APPARATUS DEPENDENT STIMULI GENERATOR DEVICE DRIVER (Block 550, which contains instructions that convert the stimuli pattern data into the appropriate numerical-control language specific to the STIMULI GENERATOR apparatus (Block 701). Suitable STIMULI GENERATOR apparatus could include, for example, the HP8180A, HP8175A, TEK DAS 9000, IMS HS1000, HiLevel TOPAZ, or other digital word generators and/or ASIC tester apparatus.

ACQUIRE WAVEFORM Block 530 implements the task "ACQUIRE WAVEFORM" by accepting the parameters, Node X-location, Node Y-location, Measurement Start Time, Measurement Stop Time, Requested Voltage Resolution, and Requested Time Resolution. These parameters are then converted to generic instructions for the APPARATUS-DEPENDENT device drivers (Blocks 550 and 560). The Measurement Start Time is converted to instructions to the APPARATUS-DEPENDENT STIMULI GENERATOR DEVICE DRIVER 550 to set the timing of the trigger output pulse which is sent to the BEAM PROBER 702 to define the start of the measurement. The difference between Start and Stop times is used to derive the instructions sent to the APPARATUS-DEPENDENT BEAM PROBER DEVICE DRIVER 560 to set the time sampling window (i.e., T/Div) of the BEAM PROBER 702. Likewise, the Requested Time Resolution will define the sampling pulse width and number of samples to be set by the APPARATUS-DEPENDENT BEAM PROBER DEVICE DRIVER 560. The Requested Voltage Resolution will define the integration time or number of averages set by the APPARATUS-DEPENDENT BEAM PROBER DEVICE DRIVER 560. If more information is needed to complete the request, such as the coordinates of a "landmark" or alignment target to allow the registration of the specimen design's coordinate system with the Beam Prober apparatus coordinate system, a "NEED REGISTRATION LANDMARK" request is sent to the EVENT MANAGER 100 via Block SEND WAVEFORM 590 (FIG. 17). The EVENT MANAGER'S response returns via Block 510, and the stage registration can be accomplished. The APPARATUS-DEPENDENT BEAM PROBER DEVICE DRIVER (Block 560), upon receiving a waveform from the BEAM PROBER (Block 702), converts it into the generic waveform format and passes it to the SEND WAVEFORM task (Block 590) for transmission back to the INSTRUMENT CONTROLLER 500 (FIG. 2).

ACQUIRE IMAGE Block 540 implements the task "ACQUIRE IMAGE" by accepting the parameters Field X location, Field Y location, Field Size, and Time Window from Block 510 (FIG. 17). In a manner similar to the "ACQUIRE WAVEFORM" task, the STIMULI GENERATOR 550 trigger timing is set, the BEAM PROBER (Block 702) and DIGITAL FRAMESTORE (Block 702A (FIG. 17) if not incorporated as part of Block 702) is set up for image acquisition. The Field Size, Field X location, and Field Y location parameters set the field of view of the image to be acquired. The APPARATUS-DEPENDENT BEAM PROBER DEVICE DRIVER 560 and the APPARATUS DEPENDENT DIGITAL FRAMESTORE DEVICE DRIVER 570 contain the instructions to convert these parameters into the numerical control language necessary for the specific apparatus used.

After the image is acquired, the APPARATUS-DEPENDENT DIGITAL FRAMESTORE DEVICE DRIVER 570 converts the image into the generic image format and sends it via Block 590 (FIG. 17) to the EVENT MANAGER 100 (FIG. 2).

The apparatus-dependent numerical control language commands and data are relayed via IEEE 488 BUS INTERFACE Block 580, which is the IEEE 488 bus interface. This is a standard I/O driver which is usually supplied as part of the operating system software of the host computer/workstation system (e.g., the IEX driver for the DEC VMS operating system). Since the apparatus-dependent functions are localized to the apparatus-dependent device drivers, these software modules can be modified to accommodate virtually any combination of specimen stimuli and probing apparatus. The rest of the software remains unchanged. A new configuration can be accommodated by simply replacing the apparatus-dependent modules and relinking the software.

INTERACTIVE DIAGNOSTIC METHODOLOGY

Figure 19:
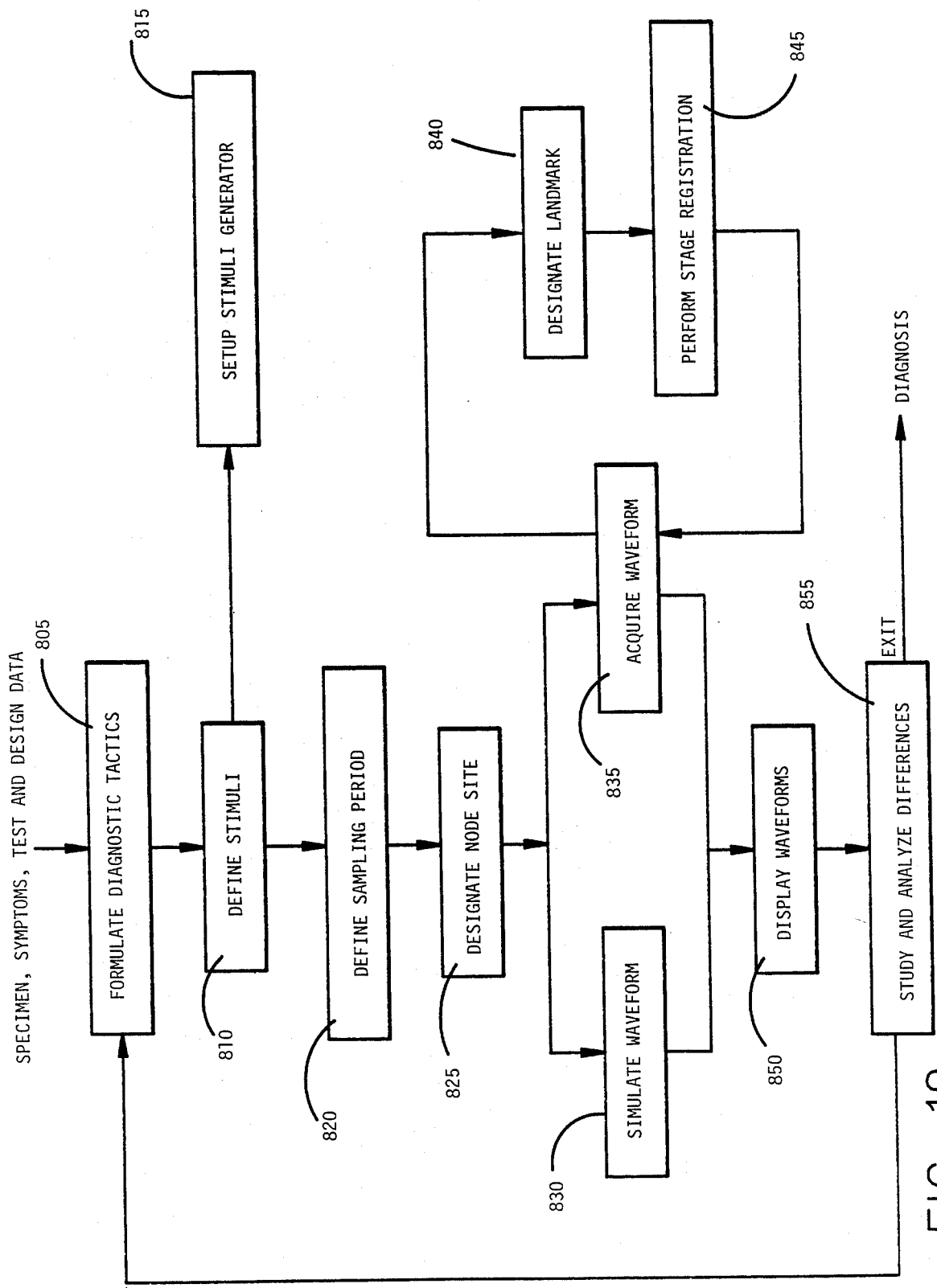
FIG. 19 shows the Interactive Diagnostic Methodology Flow Chart.

Referring to FIG. 19, with FIG. 2 supporting, there is shown the typical procedural flow followed by the Diagnostician in performing a diagnosis. It starts with the Diagnostician being given the specimen 32 (FIGS. 1 and 2), a set of symptoms, and the design and test information. It ends with the formulated diagnosis defining the design and/or process causal factors and the appropriate underlying behavioral comparisons.

First, the Diagnostician examines the design and test information to enable proper interconnection of the specimen 32 to the STIMULI GENERATOR 701 (FIG. 2) and insertion into the chamber of the BEAM PROBER 702. If the specimen is on a wafer, this generally means a probe card is interconnected to the STIMULI GENERATOR 701 while if it is a packaged device, a zero insertion force (ZIF) socket is interconnected to the STIMULI GENERATOR 701. Following insertion of the specimen into the chamber of the BEAM PROBER 702 and completion of the startup procedures for the beam probing apparatus, the diagnostic examination can commence.

Other preliminaries that the Diagnostician must perform include loading the specimen's design and functional test vectors. The specimen's design is loaded through the OBJECT CLUSTERING TRANSLATOR 300 (FIG. 2) which prepares the object-oriented symbolic representation of the specimen's design. This symbolic design representation is made available to DESIGNATE NODE SITE Block 825 (FIG. 19) and DESIGNATE LANDMARK Block 840. The functional test vectors supplied with the specimen are loaded through the TEST TRANSLATOR (Block 400 (FIG. 2), and made available to DEFINE STIMULI Block 810 (FIG. 19).

The first step for the Diagnostician is to evaluate the given set of symptoms with reference to the performance specification and test information provided about the specimen and formulate a plan of action referred to as diagnostic tactics. This step is performed in FORMULATE DIAGNOSTIC TACTICS Block 805 (FIG. 19) and controls the exploratory procedures of simulation and measurement. The Diagnostician is incrementally accumulating behavioral information aimed at formulating a diagnosis. This accumulation of behavioral information is based on comparing the acquired behavior to the expected behavior derived through beam probing and simulation techniques.

Figure 20:
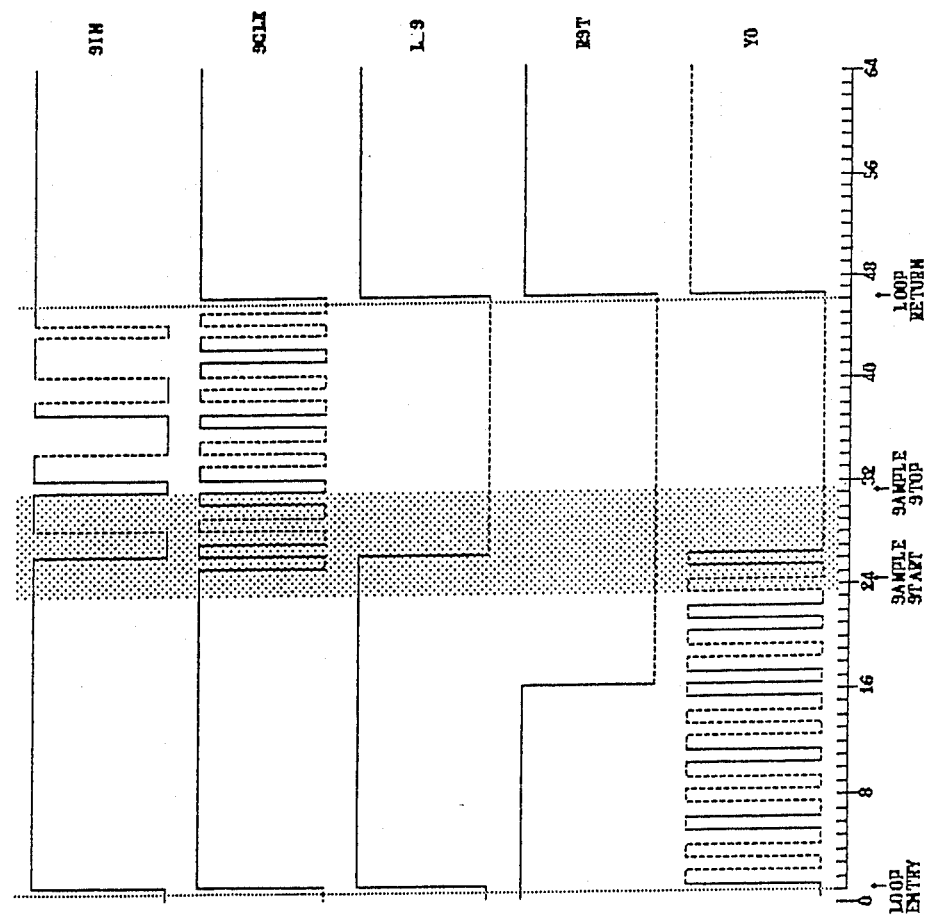
FIG. 20 illustrates the Stimuli Editor Window.

Once the next increment of tactics have been decided on, the procedure continues by stepping to DEFINE STIMULI Block 810 (FIG. 19). The Diagnostician starts with an appropriate stimuli pattern, derived from the function test pattern loaded by the TEST TRANSLATOR 400 (FIG. 2), to exercise the specimen in accordance with the planned tactics, resulting from Block 805. This procedure involves modifying a set of signals to be applied to the specimen's pads that will dynamically exercise (0→1 and 1→0 state transitions) the suspect circuitry. This interactive procedure results in the Diagnostician composing a set of signals pictorially represented on a color graphics screen, as shown in FIG. 20. Thus, the Diagnostician is able to send a modified stimuli pattern to the Stimuli Generator (Block 815) at any time deemed necessary to support a proposed exploratory tactic. The STIMULI GENERATOR 701 (FIG. 2) is now numerically controlled to apply the signal set to the specimen.

Figure 21:
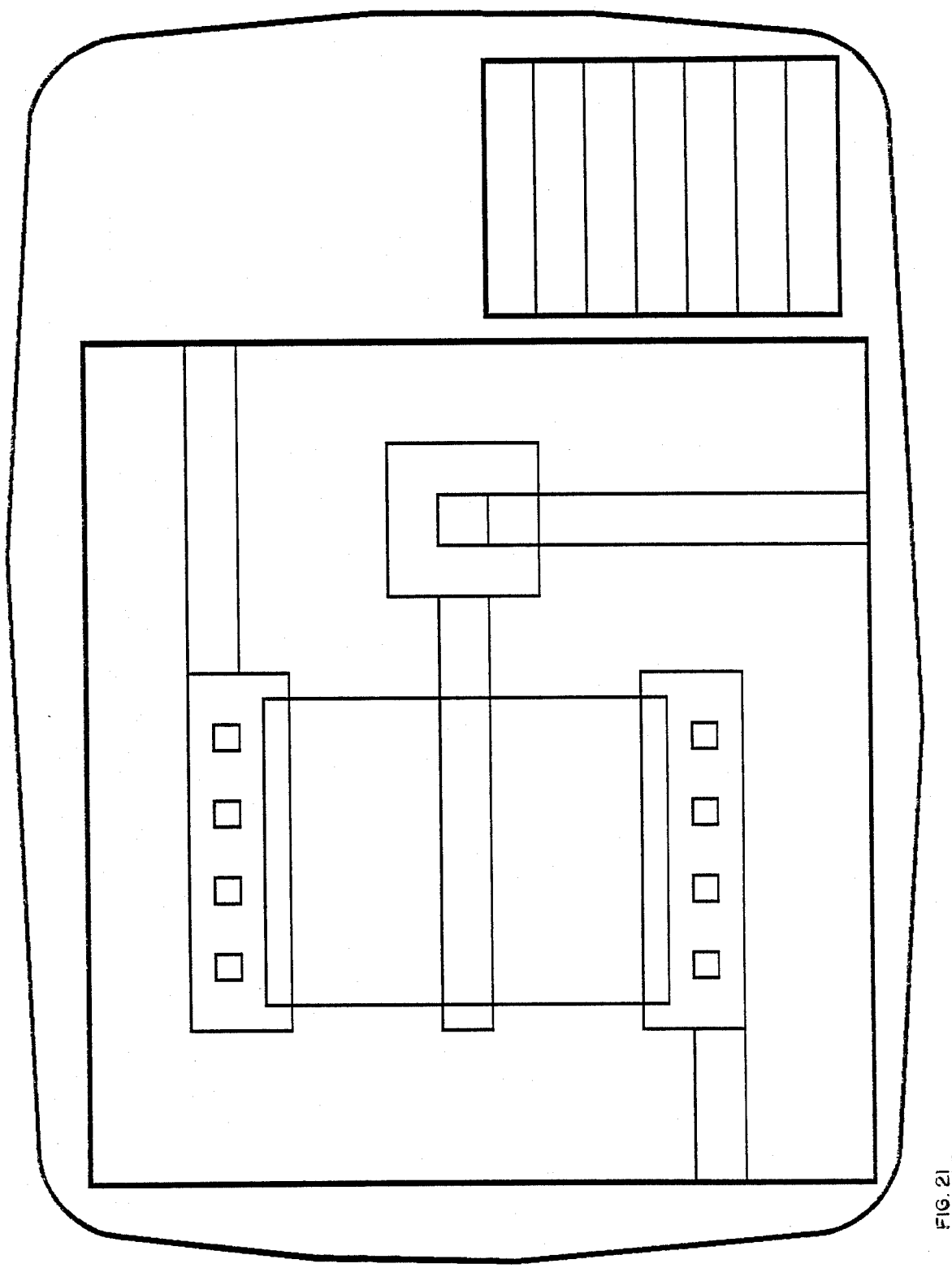
FIG. 21 illustrates the Specimen Design Window.

Next, the Diagnostician defines the sample period in DEFINE SAMPLING PERIOD Block 820 which controls the simulation and measurement time interval. This is pictorially accomplished by the Diagnostician using interactive techniques with the results being superimposed on the displayed stimuli pattern as shown in FIG. 20. Now the Diagnostician must designate the nodes of interest by using interactive symbolic navigation techniques as indicated in DESIGNATE NODE SITE Block 825 (FIG. 19). The symbolic representation of the specimen's design, as typified in FIG. 21, is assumed to have been previously loaded through the OBJECT CLUSTERING TRANSLATOR 300 (FIG. 2). Using this colored symbolic design display, the Diagnostician can zoom to named node sites or designate nodes of interest by pointing to them with mouse 50 (FIG. 3) manipulations. This interactive procedure for identifying nodes of interest is referred to as symbolic navigation.

Now that node sites have been designated by Block 825 (FIG. 19), the diagnostic methodology permits the concurrent execution of SIMULATE WAVEFORM Block 830 (FIG. 19) and ACQUIRE WAVEFORM Block 835 by spawning dynamic tasks. Block 830 performs a simulation that results in providing the expected waveforms while Block 835 concurrently performs beam probing measurements resulting in the acquired waveforms from the specimen's designated nodes. Associated with the measurement function is a stage registration problem. More specifically, a request for an acquired waveform can result in a request for landmark sites prior to performing the requested measurement. DESIGNATE LANDMARK Block 840 can request a landmark designation to guide the spatial alignment of the specimen to its related symbolic design representation. These landmarks are designated using identical mouse 50 manipulations to those used to designated nodes of interest on the color graphics display of the specimen's design, as typified in FIG. 21. After designating landmarks in Block 840, control is transferred to PERFORM STAGE REGISTRATION Block 845 to actually perform the numerical stage registration which is based on a three point triangular registration scheme. Upon successful completion of the stage registration by Block 845, ACQUIRE WAVEFORM Block 835 is released to acquire the requested waveforms from the specimen.

Figure 22:
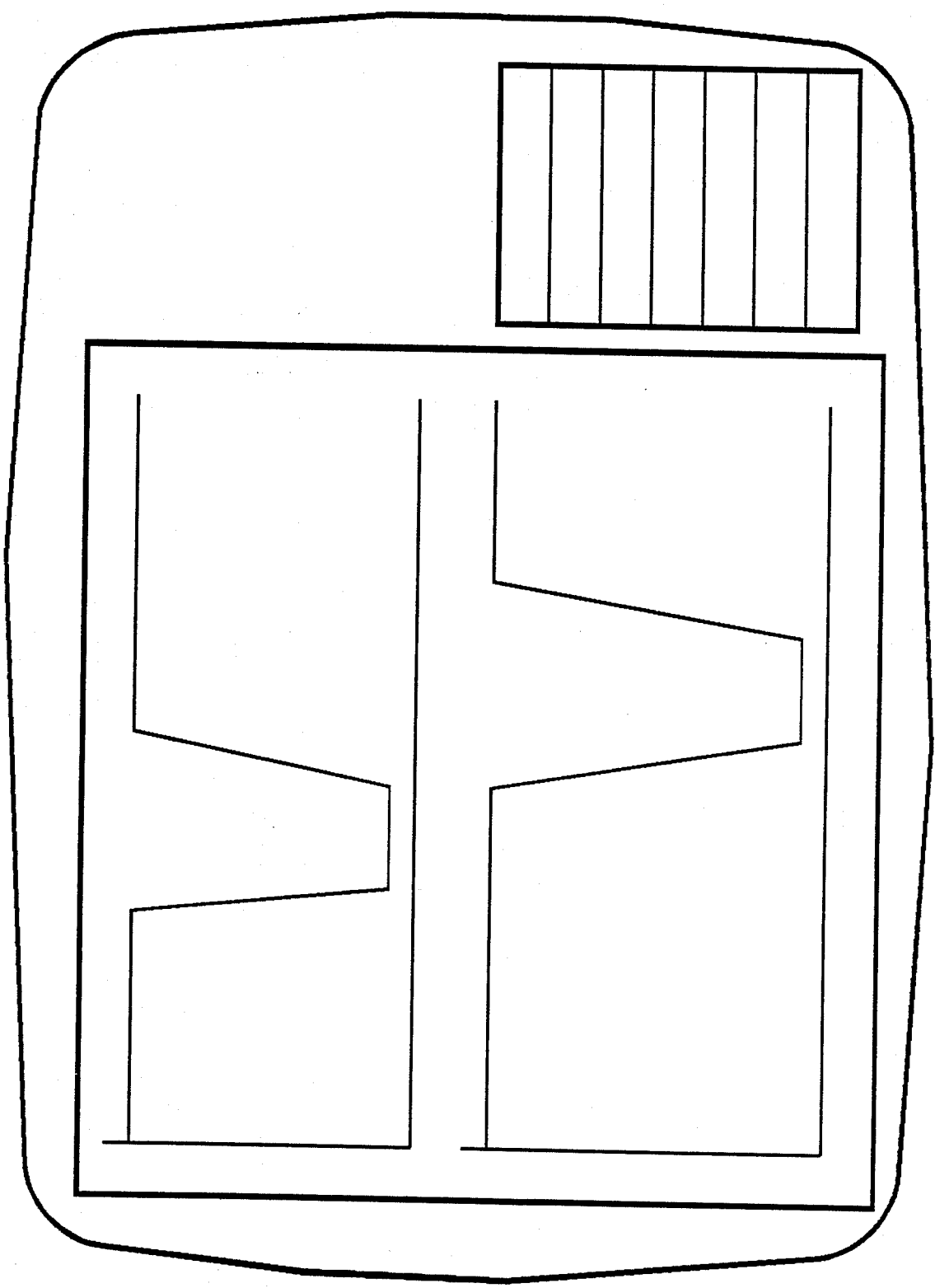
FIG. 22 illustrates the Tiered Waveform Window.
Figure 23:
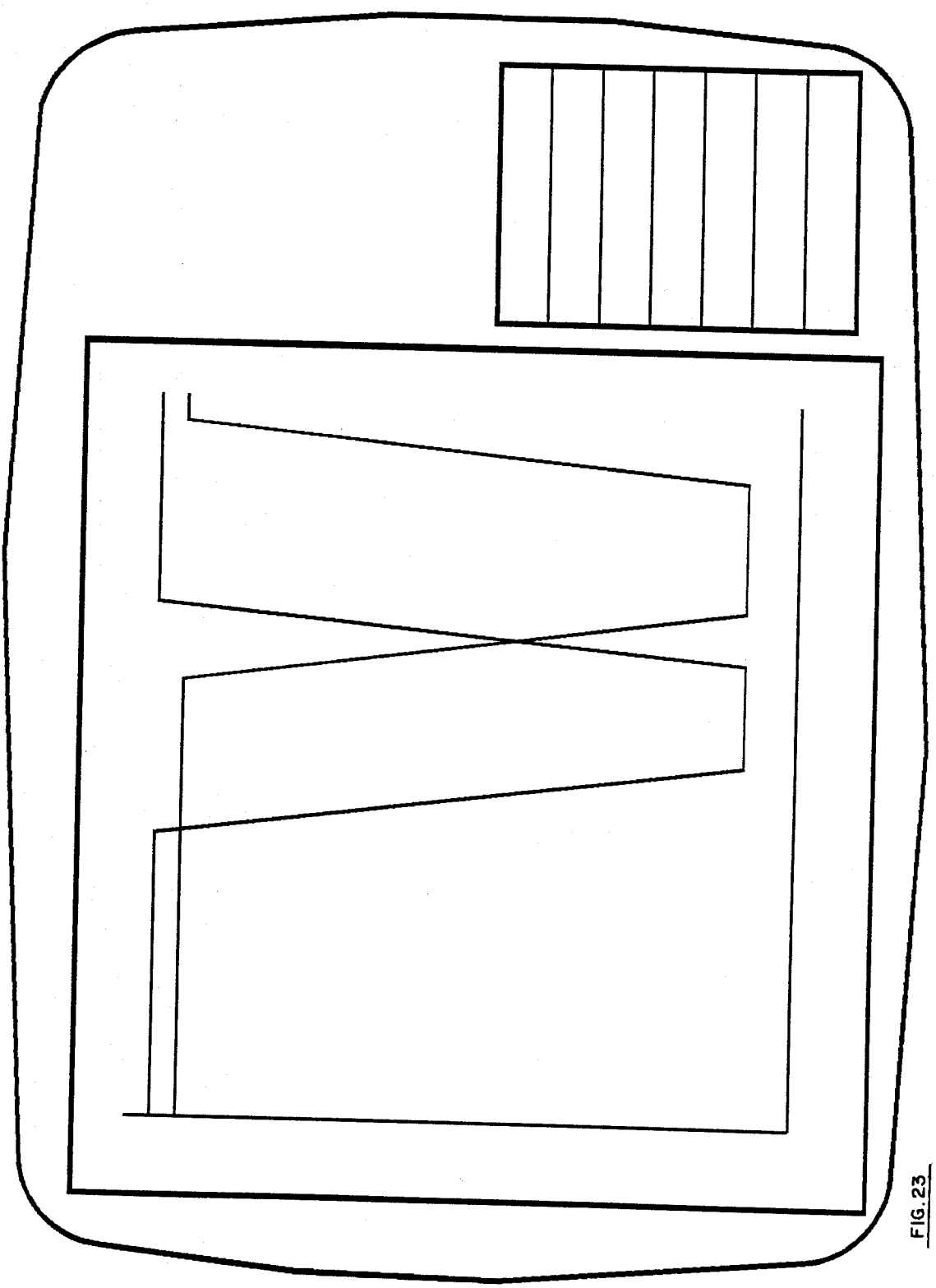
FIG. 23 illustrates the Overlaid Waveform Window.

After completion of the simulation and measurement tasks, the subject waveforms related to the designated nodes of interest can be pictorially presented to the Diagnostician by DISPLAY WAVEFORMS Block 850 in a tiered presentation, typified in FIG. 22 or in an overlaid presentation as typified in FIG. 23. Now control is passed to STUDY AND ANALYZE DIFFERENCES Block 855 for the Diagnostician to study and analyze the acquired and expected waveforms. Mouse 50 manipulation techniques allow the Diagnostician to probe the displayed waveforms and study the resulting attribute values displayed, e.g., voltage and time deltas and first derivatives. This allows the Diagnostician to analyze the study behavioral differences using pictorial presentations. If further behavioral exploration is deemed appropriate, then control is passed to FORMULATE DIAGNOSTIC TACTICS Block 805 for another interation of the methodology. If the analysis and evaluation being performed in Block 855 has identified the causal factors necessary to formulate a diagnosis, the methodology is exited with the formulated diagnosis.

Figure 24:
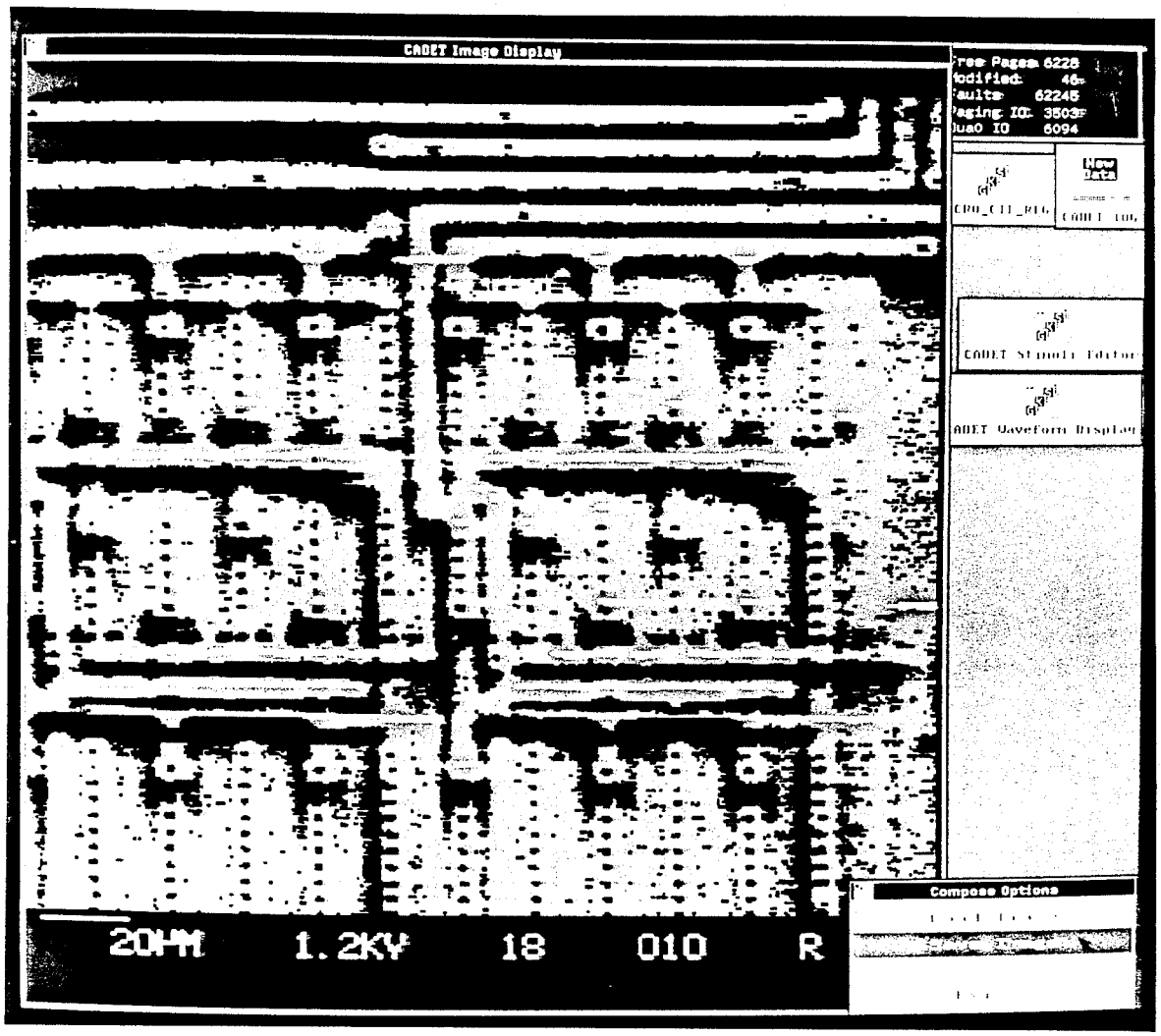
FIG. 24 illustrates the Image Window.
Figure 27:
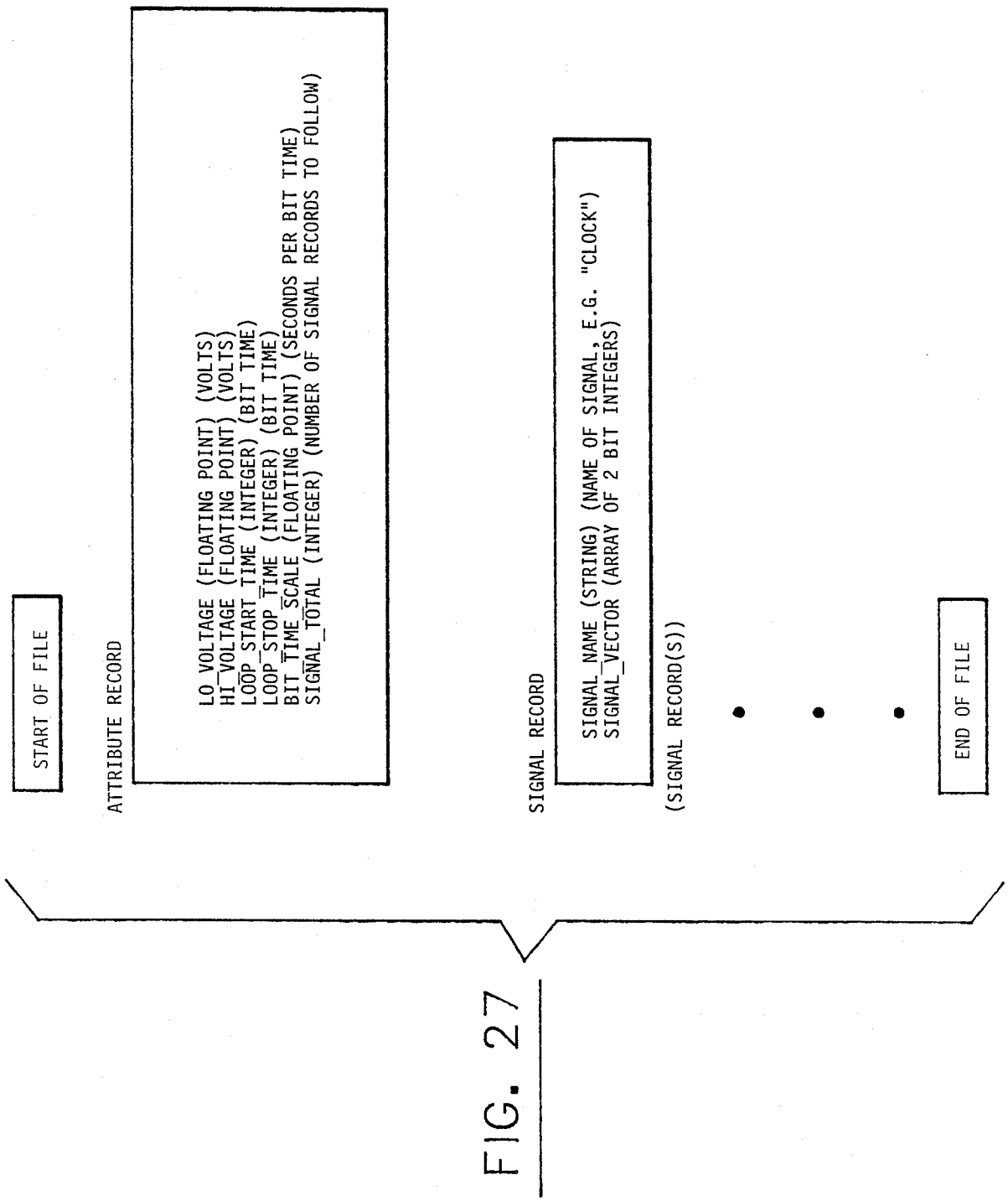
FIG. 27, including Chart 1, shows the Generic Stimuli Pattern Data Format.
Figure 28:
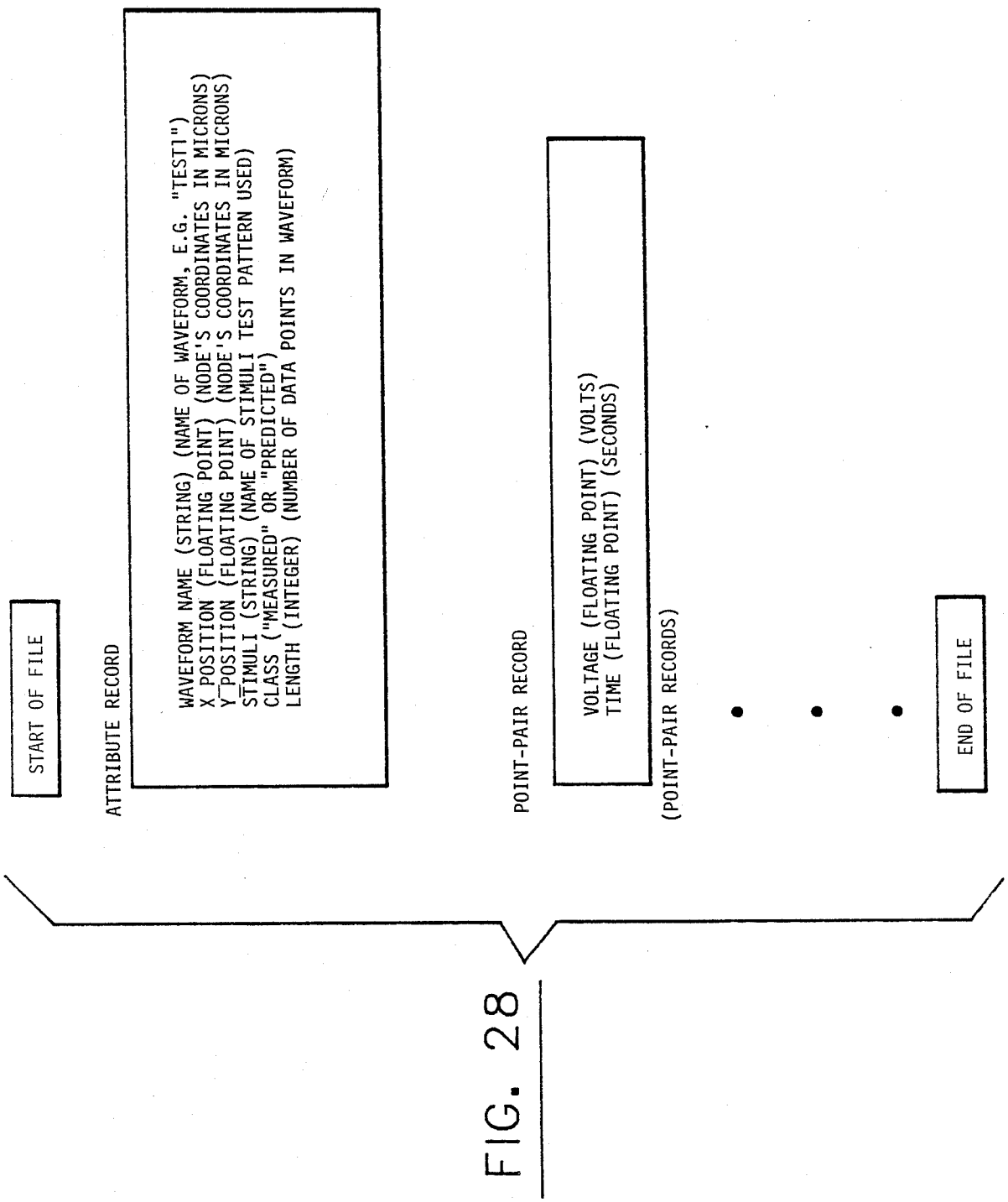
FIG. 28, with Chart 2, shows the Generic Waveform Data Format.
Figure 29:
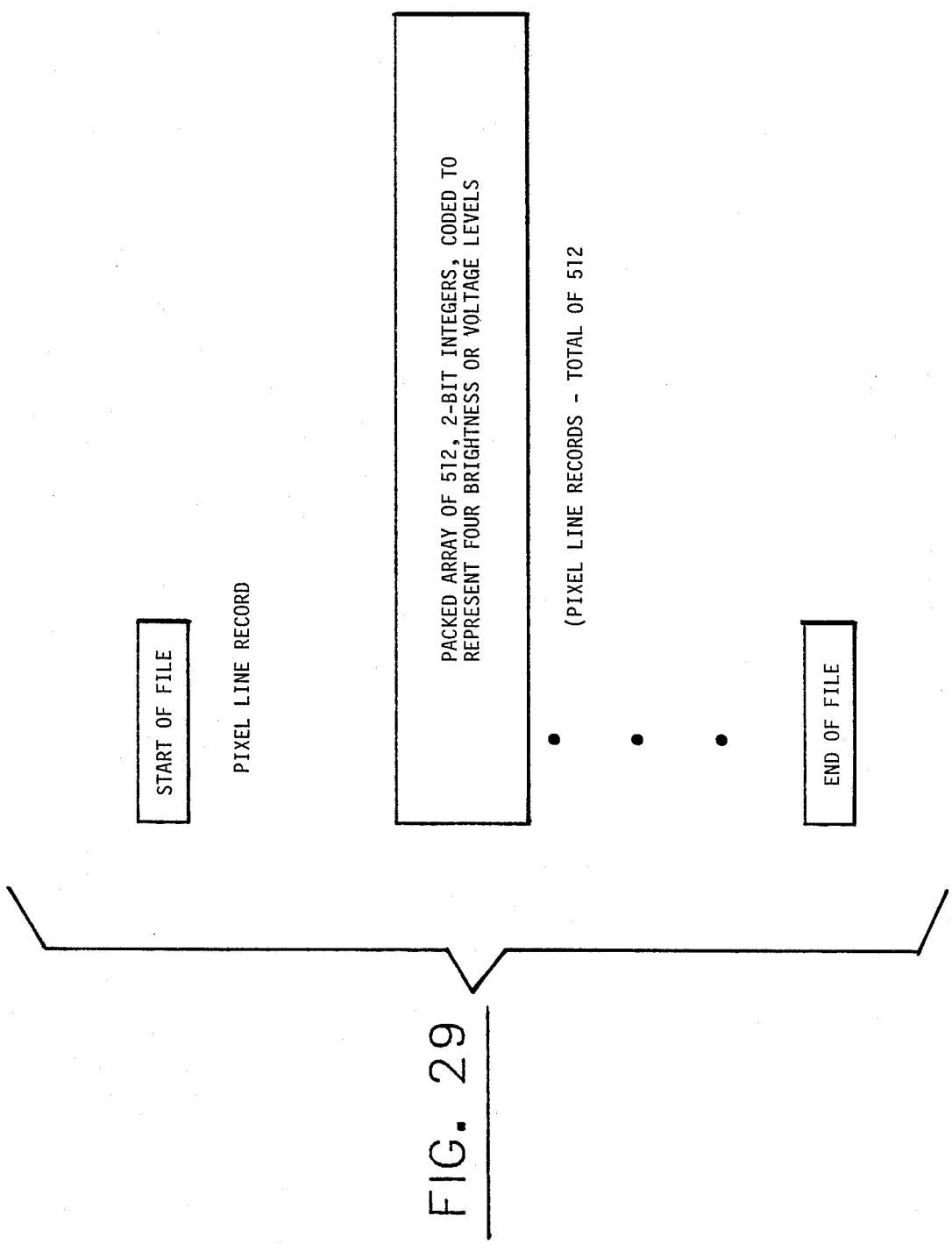
FIG. 29, comprising Chart 3, shows the Generic Image Data Format.

This interactive diagnostic methodology is primarily based on nodal-oriented information and consequently primarily involves waveform analysis techniques. However, in the initial phases of diagnosis, global relationships can be helpful in refining diagnostic tactics. Consequently, logic state maps (images) are supported in a secondary role. This is because images require considerable memory requirements and processing time as compared to waveforms. Both Blocks 825 and 830 support concurrent processing of image tasks. The resulting displays available to the Diagnostician are as shown in FIG. 24. These image displays are for a particular bit-time in the sampling period with the white conductor features representing ground potential and the black conductor features representing Vdd potential.

What is claimed is:

1. Apparatus for diagnosing abnormal behavior in a mal-functioning integrated circuit specimen comprising in combination:

noncontact probe means for acquiring voltage waveforms to be measured at selectible circuit nodes within the specimen;

stimulator means;

simulator means computer means including display means for composing, modifying and displaying input stimuli patterns for application to the stimulator means the simulator means;

said stimulator means utilizing said input stimuli patterns from the computer means for dynamically exercising the specimen to output voltage waveforms to be measured;

said simulator means storing a mathematical model of the integrated circuit specimen, as designed, in the form of object clustering data structure enabling concurrent production of corresponding predicted waveforms and waveforms to be measured due to simultaneous stimulation of the specimen and the simulator means;

said display means further exhibiting pictorial representation of the specimen layout, as described in the mathematical model, to allow an operator select a node on the layout where comparison of measured and simulated waveforms from the mathematical node and corresponding specimen node are to be made;

said simulator means outputting predicted behavioral characteristics of the circuit specimen as predicted waveforms applied to the display means along with any output waveform of the noncontact probe means acquired during said exercising; and said display means also enabling pictorial comparison of said predicted and measured waveforms to permit identification of circuit errors causing abnormal behavior in the specimen.

2. The apparatus of claim 1, wherein:

said means for dynamically exercising the specimen for acquiring measured waveforms from the specimen comprises one of word generator means and ASIC Tester means and said noncontact probe means comprises one of E-Beam prober, laser prober and ion prober means.

3. Apparatus for interactively diagnosing abnormal electrical behavior in a complex mal-functioning integrated circuit specimen having a plurality of internal nodes comprising, in combination;

means for applying electrical waveform stimuli to said specimen;

noncontact probe means for acquiring voltage waveforms at selectible circuit nodes within the specimen when the specimen stimulated;

computer means for controlling said means for applying by generating stimuli capable of providing the electrical waveform stimuli via the means of applying to stimulate the specimen, and for positioning said noncontact means relative to the nodes of said specimen when nodes are selected;

storage means accessible by the computer means for storing a mathematical model of the specimen integrated circuit, as designed, as an object clustering data structure;

said computer means connected to access said mathematical model of the specimen integrated circuit, as designed and cause the mathematical model to produce predicted waveforms for display at the computer means;

means permitting an operator to select a node on said mathematical model display and move said noncontact probe means to a corresponding node on said specimen;

said computer means connected to apply both said voltage waveforms from the probe means and said predicted waveforms for comparison to enable detection of any waveform difference between the predicted waveform and the waveform acquired by the probe, thereby locating and determining any mal-function.

4. The apparatus of claim 3, wherein:

said computer means comprise operator controlled means for directing the probe means to any node of the specimen to compare predicted and said voltage waveforms at any selected node to determine any mal-function at the selected node.

5. The apparatus of claim 4 wherein:

said computer means comprise means for using software to convert integrated circuit design data from Caltech Intermediate Form (CIF) to object clustering data format.

6. Diagnostic apparatus for determining the cause of mal-function in an integrated circuit, comprising in combination:

stimulating means for applying digital waveform stimulating patterns to exercise the circuit;

noncontact probe means for detecting the magnitude of an analog waveform at a selected node site on the circuit as a result of said exercising;

simulator means for storing a mathematical model of the integrated circuit based on an object clustering data structure for predicting analog an waveforms;

means for storing analog stimuli waveforms as digital information;

means for storing digital stimuli waveforms as digital information;

means for simultaneously applying selected stimuli to the circuit observed by the noncontact probe means and to the simulator means;

pictorial display means responsive to the stored waveform output of the noncontact probe means and to the stored waveform output of the simulator means to portray separate waveforms for each to permit determination of whether or not the waveforms agree or disagree; and graphical means responsive to the pictorial waveform display for steering the noncontact probe means to additional node sites, incrementally until the node site indicating a mal-function by waveform disagreement is located.

7. A method for interactively diagnosing abnormal electrical behavior in a complex mal-functioning integrated circuit specimen having a plurality of internal nodes, comprising the steps of:

noncontact probing for determining the voltage waveforms at selectible circuit nodes within the specimen when the specimen is stimulated;

storing a mathematical model of the integrated circuit, as an object clustering data structure, capable of being stimulated by mathematical stimuli;

applying stimuli to the mathematical model by using said mathematical stimuli capable of providing electrical waveform stimuli output for display to permit node selection by an operator and for positioning said noncontact probing relative to the nodes of said specimen in correspondence to the selected nodes of the model displayed output;

stimulating said circuit for generating and receiving node waveforms by and from said noncontact probing to display said node waveforms;

providing stimuli to the input to the mathematical model of the specimen integrated circuit to produce predicted waveform which is compared by the operator to the waveform determined by the probe at the selected nodes to detect any waveform difference between the design predicted waveform and the waveform measured by the probe, thereby locating and determining any mal-function.

8. The method of claim 7 wherein:

said applying stimuli comprises directing the probing to any node of the specimen to compare predicted and node waveforms at any selected node to determine any mal-function at the selected node.

9. The method of claim 8 wherein:

said storing of said mathematical model comprises converting integrated circuit design data from Caltech Intermediate Form (CIF) to object clustering data format.

10. A method for determining the cause of mal-function in an integrated circuit, comprising the steps of:

noncontact probing for detecting the magnitude of an analog waveform at a selected node site on the circuit;

storing a mathematical model of the integrated circuit based on an object clustering data structure for predicting analog and digital waveform;

storing analog measured and predicted waveforms;

storing digital stimuli waveforms;

simultaneously applying selected stimuli to the circuit observed by the noncontact probing and to the stored mathematical model underlying the simulation;

displaying a response to the stored output of the noncontact probing and to the stored simulated output of the mathematical model to portray separate waveforms for each to permit determination of whether or not the waveforms agree or disagree; and steering the noncontact probing to additional node sites for exploring circuit behavior, incrementally until the node site indicating a mal-function by waveform disagreement is identified.

* * * * *

UNITED STATES PATENT AND TRADEMARK OFFICE
CERTIFICATE OF CORRECTION

PATENT NO. : 4,878,179
DATED : Oct. 31, 1989
INVENTOR(S) : Robert P. Larsen, Steven T. Hoelke, James A. Luisi It is certified that error appears in the above-identified patent and that said Letters Patent is hereby corrected as shown below:

Column 19, line 49, after the word "means" and before the word "the", insert --and to--.

Column 20, line 28, after the word "means" and before the word "apply-", change the word "of" to --for--.

Column 21, line 6, after the word "analog" and before the word "waveforms;", change the word "an" to --and digital--.

Column 22, line 6, after the word "duce" and before the word "predicted", insert --a design--.

Signed and Sealed this

Twenty-first Day of May, 1991

Attest:

HARRY F. MANBECK, JR.

*Attesting Officer*     *Commissioner of Patents and Trademarks*